(12) United States Patent
Kaplan

(10) Patent No.: US 7,193,548 B2
(45) Date of Patent: Mar. 20, 2007

(54) SWITCHING ARRANGEMENT AND DAC MISMATCH SHAPER USING THE SAME

(75) Inventor: Todd Kaplan, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/824,569

(22) Filed: Apr. 13, 2004

(65) Prior Publication Data

US 2005/0168365 A1 Aug. 4, 2005

Related U.S. Application Data

(60) Provisional application No. 60/540,909, filed on Jan. 30, 2004.

(51) Int. Cl.
*H03M 1/66* (2006.01)

(52) U.S. Cl. .................. 341/144; 341/143; 341/118

(58) Field of Classification Search ................ 341/144, 341/143, 118, 120
See application file for complete search history.

(56) References Cited

U.S. PATENT DOCUMENTS

| | | | | |
|---|---|---|---|---|
| 5,404,142 A * | 4/1995 | Adams et al. | ............... | 341/144 |
| 5,621,407 A * | 4/1997 | Jeong et al. | ............... | 341/143 |
| 5,684,482 A | 11/1997 | Galton | ............... | 341/144 |
| 5,982,317 A | 11/1999 | Steensgaard-Madsen | .... | 341/143 |
| 6,124,813 A * | 9/2000 | Robertson et al. | ........... | 341/143 |
| 6,137,431 A | 10/2000 | Lee et al. | ............... | 341/161 |
| 6,211,805 B1 | 4/2001 | Yu | ............... | 341/155 |
| 6,271,782 B1 | 8/2001 | Steensgaard-Madsen | .... | 341/143 |
| 6,326,912 B1 | 12/2001 | Fujimori | ............... | 341/143 |
| 6,348,884 B1 * | 2/2002 | Steensgaard-Madsen | .... | 341/118 |
| 6,373,424 B1 | 4/2002 | Soenen | ............... | 341/161 |
| 6,437,718 B1 | 8/2002 | Oyama et al. | ............... | 341/143 |
| 6,441,759 B1 | 8/2002 | Raghavan et al. | ........... | 341/143 |
| 6,456,218 B1 | 9/2002 | Dedic et al. | ............... | 341/144 |
| 6,469,646 B1 | 10/2002 | Song | ............... | 341/144 |
| 6,473,011 B1 | 10/2002 | Steensgaard-Madsen | .... | 341/118 |
| 6,496,129 B2 | 12/2002 | Dedic et al. | ............... | 341/144 |
| 6,518,899 B2 | 2/2003 | Yu | ............... | 341/118 |
| 6,522,277 B2 | 2/2003 | Fujimori et al. | ............ | 341/144 |
| 6,531,973 B2 | 3/2003 | Brooks et al. | ............... | 341/143 |
| 6,556,158 B2 | 4/2003 | Steensgaard-Madsen | .... | 341/131 |
| 6,577,257 B2 | 6/2003 | Brooks | ............... | 341/131 |
| 6,577,261 B2 | 6/2003 | Brooks et al. | ............... | 341/144 |
| 6,614,377 B1 * | 9/2003 | Adams et al. | ............... | 341/144 |
| 6,628,218 B2 | 9/2003 | Brooks et al. | ............... | 341/143 |

(Continued)

OTHER PUBLICATIONS

Galton, I., "Spectral Shaping of Circuit Errors in Digital-to-Analog Converters," *IEEE Tranactions on Circuits and Systems-II: Analog and Digital Signal Processing*, vol. 44, No. 10, pp. 808-817 (Oct. 1997).

(Continued)

*Primary Examiner*—Linh V. Nguyen
(74) *Attorney, Agent, or Firm*—Ladas & Parry LLP

(57) ABSTRACT

A digital-to-analog converter (DAC) error mismatch shaper. The shaper comprises a switching arrangement with a delta-sigma modulator having analog signal processing components. The analog signal processing components allow the spectral behavior of the shaper to be controlled. The switching arrangement comprises a control circuit. The control circuit is a tunable, pipelined control circuit.

64 Claims, 19 Drawing Sheets

U.S. PATENT DOCUMENTS

| | | | |
|---|---|---|---|
| 6,633,248 B2 | 10/2003 | Song | 341/144 |
| 6,661,362 B2 | 12/2003 | Brooks | 341/143 |
| 6,720,897 B1* | 4/2004 | Wang | 341/143 |
| 6,738,004 B2* | 5/2004 | Melanson | 341/143 |
| 6,842,130 B2* | 1/2005 | Wang et al. | 341/143 |
| 6,873,280 B2* | 3/2005 | Robinson et al. | 341/159 |
| 2002/0105449 A1* | 8/2002 | Schreier et al. | 341/139 |
| 2004/0021594 A1* | 2/2004 | Melanson | 341/143 |
| 2005/0062629 A1* | 3/2005 | Roger et al. | 341/144 |

OTHER PUBLICATIONS

Geerts, Y., et al., "A 2.5M Sample/s Multi-Bit ΔΣ CMOS ADC with 95db SNR," *IEEE International Solid-State Circuits Conference Digest of Technical Papers*, pp. 336-337, 468 (2000), no month.

Hernandez, L., et al., "Programmable Sine Wave Generator Employing a Mismatch-Shaping DAC," *ICECS Dig. Tech. Papers*, pp. 135-138 (1998), no month.

Jensen, H.T., et al., "A Reduced-Complexity Mismatch-Shaping DAC for Delta-Sigma Data Converters," *IEEE*, pp. I-504-I-507 (1998), no month.

Kaplan, T., et al., "A 1.3 Ghz IF Digitizer Using A 4th-Order Continuous-Time Bandpass ΔΣ Modulator," *IEEE 2003 Custom Integrated Circuits Conference*, Session 7-5, pp. 127-130 (2003), no month.

Kuo, Tai-Haur, et al., "A Wideband CMOS Sigma-Delta Modulator With Incremental Data Weighted Averaging," *IEEE Journal of Solid-State Circuits*, vol. 37, No. 1, pp. 11-17 (Jan. 2002).

Lin, H., et al., "A Bandpass Mismatch-Shaped Multi-Bit ΣΔ Switched-Capacitor DAC Using Butterfly Shuffler," 1999 IEEE International Solid-State Circuits Conference Digest of Technical Papers, pp. 58-59 (1999), no month.

Miller, M.R., et al., "A Multibit Sigma-Delta ADC for Multimode Receivers," IEEE Journal of Solid-State Circuits, vol. 38, No. 3, pp. 475-482 (Mar. 2003).

Park, Yong-In, et al., "A 16-Bit, 5MHz Multi-Bit Sigma-Delta ADC Using Adaptively Randomized DWA," *IEEE 2003 Custom Integrated Circuits Conference*, pp. 115-118 (2003).

Razavi, B., *Design of Analog CMOS Integrated Circuits*, McGraw-Hill, pp. 309-310 (2001), no month.

Sakina, Y., "Multi-Bit ΣΔ Analog-To-Digital Converters with Nonlinearity Correction Using Dynamic Barrel Shifting," *Electronics Research Laboratory*, College of Engineering, University of California, Berkeley, Memorandum No. UCB/ERL M93/63, pp. 1-73 (Jul. 26, 1993).

Schofield, W., et al., "A 16b 400MS/s DAC with <-80dBc IMD to 300MHz and <-160dBm-Hz Noise Power Spectral Density," *ISSCC Digest of Technical Papers*, 10 pages total (2003), no month.

Schreier, R., et al., "Noise-Shaped Multibit D/A Convertor Employing Unit Elements," *Electronics Letters*, vol. 31, No. 20, pp. 1712-1713 (Sep. 28, 1995).

Shui, T., et al., "Mismatch Shaping for a Current-Mode Multibit Delta Sigma DAC," *IEEE Journal of Solid State Circuits*, vol. 34, No. 3, pp. 331-338 (Mar. 1999).

Sokolich, M., et al., "A Low Power 72.8-GHz Static Frequency Divider in AlInAs/InGaAs HBT Technology," *IEEE Journal of Solid-State Circuits*, vol. 36, No. 9, pp. 1328-1334 (Sep. 2001).

Ueno, T., et al., "A Fourth-Order Bandpass Δ-Σ Modulator Using Second-Order Bandpass Noise-Shaping Dynamic Element Matching," *IEEE Journal of Solid State Circuits*, vol. 37, No. 7, pp. 809-816 (Jul. 2002).

Van der Zwan, E.J., et al., "A 0.2-mW CMOS ΣΔ Modulator for Speech Coding with 80 dB Dynamic Range," *IEEE Journal of Solid-State Circuits*, vol. 31, No. 12, pp. 1873-1880 (Dec. 1996).

Vleugels, K., et al., "A 2.5-V Sigma-Delta Modulator for Broadband Communications Applications," *IEEE Journal of Solid-State Circuits*, vol. 36, No. 12, pp. 1887-1899 (Dec. 2001).

Vorenkamp, P., et al., "Fully Bipolar, 120-Msample/s 10-b Track-and-Hold Circuit," *IEEE Journal of Solid-State Circuits*, vol. 27, No. 7, pp. 988-992 (Jul. 1992).

Welz, J., et al., "Simplified Logic for First-Order and Second-Order Mismatch-Shaping Digital-to-Analog Converters," *IEEE Transactions on Circuits and Systems-II: Analog and Digital Signal Processing*, vol. 48, No. 11, pp. 1014-1027 (Nov. 2001).

\* cited by examiner

SWITCHING ARRANGEMENT AND DAC MISMATCH SHAPER USING THE SAME

CLAIM OF BENEFIT OF PROVISIONAL APPLICATION

This application claims the benefit of U.S. provisional application No. 60/540,909, "Switching Arrangement and DAC Mismatch Shaper Using the Same," filed on Jan. 30, 2004, which is incorporated herein by reference in its entirety.

STATEMENT REGARDING FEDERALLY SPONSORED RESEARCH OR DEVELOPEMENT

This invention was made with Government support under Contract Number N00014-99-C-0144 awarded by the Department of the Navy. The Government has certain rights in the invention.

BACKGROUND

1. Field

The present disclosure relates to data conversion. In particular, it relates to a switching arrangement and to a digital-to-analog converter (DAC) mismatch shaper using the same.

2. Related Art

Direct data conversion at IF frequencies offers many advantages in transceiver design. By eliminating the IF mixers and filters, the resultant system is smaller and simpler than a traditional IF transceiver architecture. Additionally, by eliminating the 1st-IF upconversion, direct-IF data conversion avoids the noise, linearity, I/Q cancellation and clock feedthrough issues that plague mixer designs. Finally, the flexibility inherent in direct IF data conversion helps enable software-defined radio.

A linear, high-resolution, IF-generating DAC is an important component in direct IF data conversion. This DAC is an important building block in synthesizing a signal on the transmitter end, and is also an important building block in DS modulators that can directly digitize IF signals.

Multibit DACs, however, have limited linearity and resolution due to mismatch errors. Static mismatch errors occur when each DAC is driven by slightly different current sources, and dynamic timing errors occur when either the routing is unequal, or if the individual elements operate at different speeds. To correct for these errors, some type of electronic mismatch-correction needs to be implemented. Dynamic calibration, based on charge storage on the gate of the current-source transistors is a useful method for CMOS DACs, as shown in W. Schofield, D. Mercer. L. St. Onge, "A 16b 400 Ms/s DAC with <−80 dBc IMD to 300 MHz and <−160 dBm/Hz Noise Power Spectral Density", ISSCC Digest of Technical Papers, 2003.

However, the highest-speed DACs use bipolar transistors. The calibration method in the above Schofield paper cannot be applied to bipolar implementations because the charge cannot be easily stored on the base of the transistor. Furthermore, calibration techniques only correct static mismatch errors, and hence some type of dynamic routing is necessary to correct timing errors.

Mismatch shapers are attractive for linearization because they can shape static and dynamic DAC mismatch errors away from a frequency of interest for a wide variety of DAC architectures, technologies, and types of mismatches. However, mismatch-shaping circuitry to date has been too slow to linearize direct-IF generating DACs. Due to the algorithmic complexity and resultant critical path delays, the fastest published mismatch shaped DACs are clocked at 60 MHz, as shown in Katelijn Vleugels, Shahriar Rabii, Bruce Wooley, "A 2.5-V Sigma-Delta Modulator for Broadband Communications Applications," IEEE JSSC, vol. 36, no. 12, December 2001.

The faster mismatch shapers use averaging algorithms that are only suitable for generating signals at a small fraction of the sampling frequency, and as a result, the highest linearized IF produced was 2 MHz, as shown in the above Vleugels paper.

Bandpass mismatch shapers, which can theoretically be used to help directly generate signals closer to the Nyquist rate, have considerably higher system complexity and resultantly higher critical path delays. Thus, the highest IF directly generated from a bandpass mismatch shaper was 1.25 MHz, using a 5 MHz clock, as shown in L. Hernandez, A. Quesada, "Programmable Sine Wave Generator Employing a Mismatch-Shaping DAC," ICECS Dig. Tech. Papers, 1998, pp. 135–138. Furthermore, none of these mismatch shapers have been tunable, and hence may not offer the needed flexibility for software-defined radio.

SUMMARY

According to a first aspect of the present disclosure, a switching arrangement is provided comprising: a digital input comprising a first digital input portion and a second digital input portion; a digital output comprising a first digital output portion and second digital output portion; a switching element between the digital input and the digital output, the switching element having a first condition allowing the first digital output portion to correspond to the first digital input portion and the second digital output portion to correspond to the second digital input portion, and a second condition allowing the first digital output portion to correspond to the second digital input portion and the second digital output portion to correspond to the first digital input portion; and a control arrangement to switch the switching element between the first condition and the second condition.

According to a second aspect, a circuit is provided, comprising: a first input and a second input; a control element connected with the first input and second input; a switch either switching or not switching the first input and the second input according to the control element; and a clocking arrangement to pipeline the switch.

According to a third aspect, a circuit is provided, comprising: a first input and a second input; a control element connected with the first input and the second input; a switch either switching or not switching the first input and the second input according to the control element; and a tuning arrangement to frequency-adjust the switch.

According to a fourth aspect, a switching arrangement is provided, comprising: a first digital input; a second digital input; a switch for switching the first digital input and the second digital input; an evaluation element connected with the first digital input and the second digital input, the evaluation element evaluating whether the first digital input and the second digital input are in a predetermined relationship therebetween; a control element to control switching of the switch, the control element connected with the evaluation element and the switching element, the control element comprising a quantizer having a quantizer output, wherein switching between the first digital input and the second digital input depends on the quantizer output when the first digital input and the second digital input are in the predetermined relationship therebetween and switching between the first digital input and the second digital input does not depend on the quantizer output when the first digital input and the second digital input are not in the predetermined relationship therebetween.

According to a fifth aspect, a mismatch error shaper is provided, comprising: a) a digital input, comprising a plurality of bits; b) a plurality of routing blocks routing the bits of the plurality of bits, wherein each routing block of the plurality of routing blocks comprises: b1) a digital input having a first digital input portion and a second digital input portion; b2) a switch for switching the first digital input portion and the second digital input portion; b3) an evaluation element connected with the first digital input portion and the second digital input portion, the evaluation element evaluating whether the first digital input portion and the second, digital input portion are in a predetermined relationship therebetween; b4) a control element to control switching of the switch, the control element comprising a quantizer having a quantizer output, wherein switching between the first digital input portion and the second digital input portion depends on the quantizer output when the first digital input portion and the second digital input portion are in the predetermined relationship therebetween and switching between the first digital input portion and the second digital input portion does not depend on the quantizer output when the first digital input portion and the second digital input portion are not in the predetermined relationship therebetween; c) a plurality of digital outputs; and d) an adder, adding the outputs of the plurality of digital outputs.

According to a sixth aspect, a method is provided, comprising: providing a digital input comprising a first digital input portion and a second digital input portion; providing a digital output comprising a first digital output portion and a second digital output portion; and either switching the first digital input portion and the second digital input portion, to make the first digital input portion correspond with the second digital output portion and the second digital input portion correspond with the first digital output portion, or not switching the first digital input portion and the second digital input portion, to make the first digital input portion correspond with the first digital output portion and the second digital input portion correspond with the second digital output portion, wherein switching is performed when the first digital input portion and the second digital input portion are in a predetermined relationship therebetween, and not switching is performed when the first digital input portion and the second digital input portion are not in the predetermined relationship therebetween.

According to a seventh aspect, a method for testing mismatch shaping is provided, comprising: providing a circuit, the circuit comprising a first input and a second input, a control arrangement; and a switching arrangement either switching or not switching the first input and the second input according to the control arrangement, the circuit having a first circuit output and a second circuit output; providing a first DAC having a first DAC input and a second DAC input; providing a second DAC having a second DAC input and a second DAC output; connecting the first circuit output with the first DAC input and the second circuit output with the second DAC input; subtracting the second DAC output from the first DAC output to provide a difference output; and inputting the difference output to a spectrum analyzer.

According to an eighth aspect, a method for testing mismatch shaping is provided comprising: providing a circuit, the circuit comprising a first input and a second input, a control arrangement; and a switching arrangement either switching or not switching the first input and the second input according to the control arrangement, the circuit having a first circuit output and a second circuit output; providing a first DAC having a first DAC input and a second DAC input; providing a second DAC having a second DAC input and a second DAC output; connecting the first circuit output with the first DAC input and the second circuit output with the second DAC input; subtracting the second DAC output from the first DAC output to provide a difference output; and inputting the difference output to a spectrum analyzer.

Preferably, the switching arrangement and circuits comprise a delta-sigma modulator.

It follows that the present disclosure also provides a mismatch shaper that could compute its output over one or more clock delays, and thus could work at a much higher clock rate. According to a preferred embodiment of the present disclosure, a 3-bit mismatch-shaped delta-sigma modulated DAC can generate narrowband signals between 250 MHz and 750 MHz, with less than −80 dBc (decibel per carrier) intermodulation distortion in the entire frequency range.

BRIEF DESCRIPTION OF THE DRAWINGS

The present invention will be understood and appreciated more fully from the following detailed description taken in conjunction with the drawings in which.

DETAILED DESCRIPTION

Figure 1:
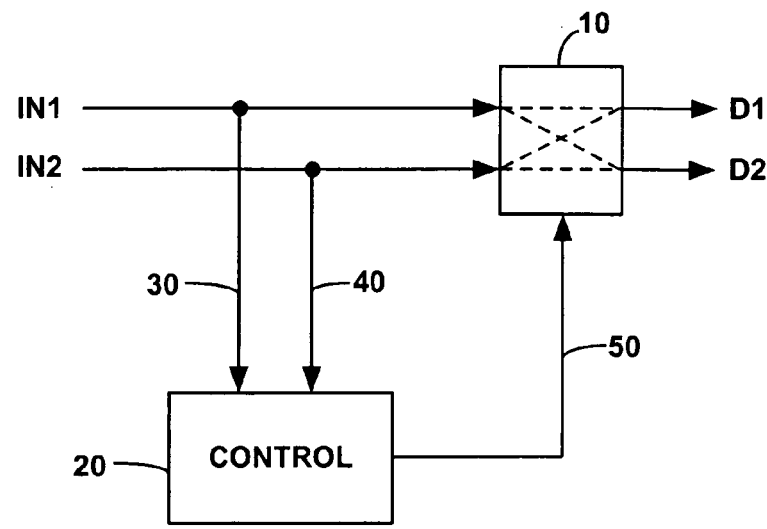
FIG. 1 shows a switching arrangement according to the present disclosure.

FIG. 1 shows a switching arrangement according to the present disclosure. The arrangement comprises a first digital input IN1, a second digital input IN2, a first digital output D1, and a second digital output D2. IN1 and IN2 can be n-bit digital signals, and can be originated from a 2n-bit digital signal. A switching element 10 is located between the inputs and the outputs. The switching element 10 has a first, non-switching, condition where the inputs IN1, IN2 are not switched, so that the first digital output D1 corresponds to the first digital input IN1 and the second digital output D2 corresponds to the second digital input IN2. The switching element 10 also has a second, switching, condition where the inputs IN1, IN2 are switched, so that the first digital output D1 corresponds to the second digital input IN2 and the second digital output D2 corresponds to the first digital input IN1.

Switching is controlled by a control arrangement 20, which allows the switching element 10 to switch between the first condition and the second condition. The control arrangement 10 has two inputs 30, 40 and one control output 50. The two inputs 30, 40 are the first and second digital input IN1, IN2. If the first digital input IN1 is different from the second digital input IN2, the control signal 50 allows the switching element 10 to switch the input signals. If the first digital input IN1 is not different from the second digital input IN2, switching or not switching of the switch element 10 does not affect the output signals.

Figure 2:
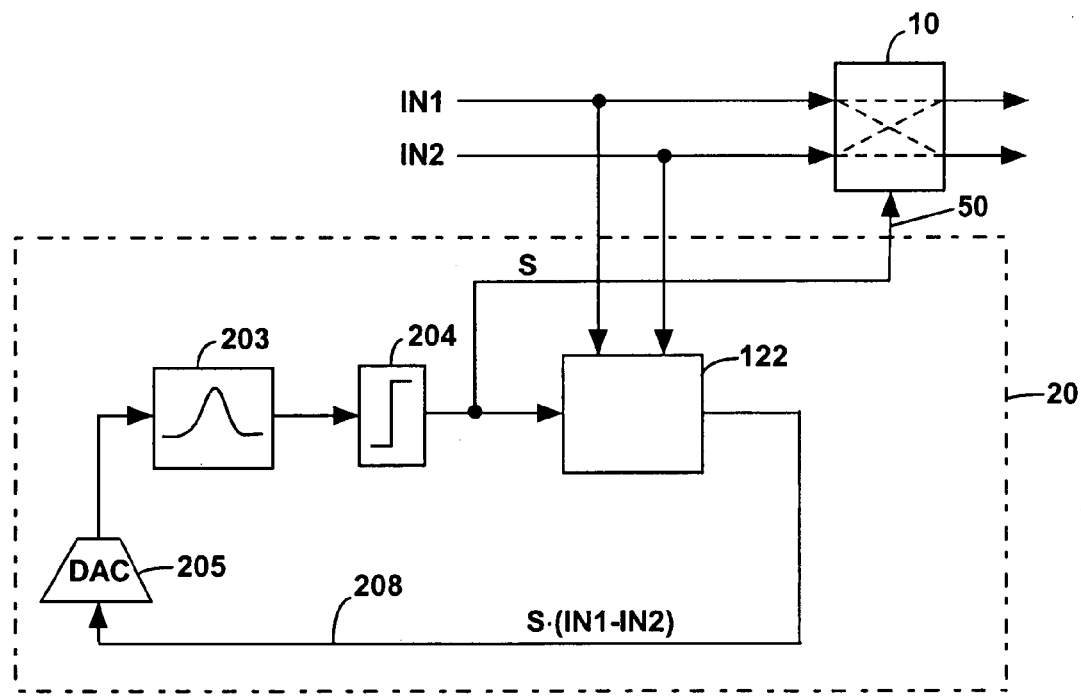
FIG. 2 shows a first embodiment of a control arrangement shown in FIG. 1.

FIG. 2 is a schematic block diagram showing a first embodiment of the control arrangement 20. In particular, the control arrangement 20 comprises a block 122 which multiplies the output signal 50 (also indicated with 'S' in the Figure) with the difference IN1−IN2 between the signals IN1 and IN2. For example, the block 122 could comprise a subtractor to subtract the signals IN1 and IN2 and a multiplier, to multiply the signal S with the result of the subtraction. FIG. 2 also shows a delta-sigma modulator, comprising a filtering element such as a resonator, preferably a second-order resonator 203, a quantizer 204, for example a comparator, and a digital-to-analog (DAC) converter 205. The output 202 is input into the delta-sigma modulator by means of a multiplier 206. The value of the signal on the path 208 will be S·(IN1−IN2).

Figure 3:
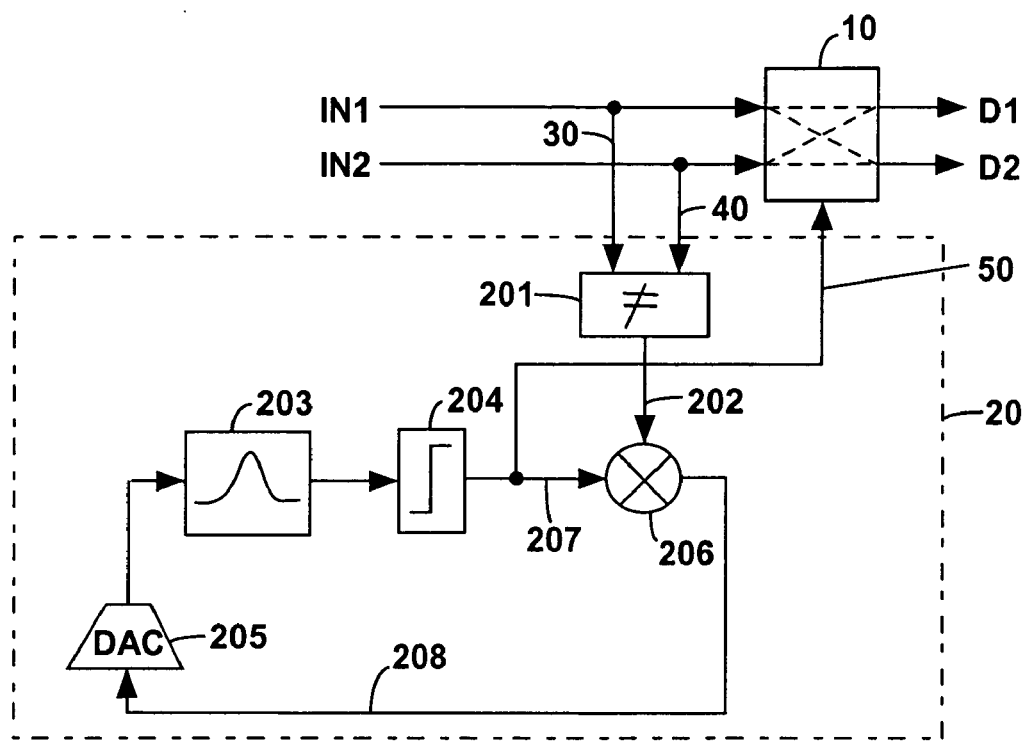
FIG. 3 shows a second embodiment of a control arrangement shown in FIG. 1.

FIG. 3 is a schematic block diagram showing a further embodiment of the control arrangement 20. In particular, the control arrangement 20 comprises a circuit 201 which establishes whether the sum of the high values of the signal IN1 is different from the sum of the high values of the signal IN2 or not. A circuital arrangement like circuit 201 is known as such to the person skilled in the art, and will not be described in detail. The circuit 201 has inputs 30, 40 and an output 202. The output 202 is input into the delta-sigma modulator by means of a multiplier 206. The output 202 can either have a high logic value or a low logic value. For example, the output 202 has a high logic value if the signals 30, 40 are different and a low logic value if the signals 30, 40 are not different.

If the output 202 has a low logic value, the output 207 of the forward path of the delta-sigma modulator is not fed back to the modulator through the feedback path 208. Instead, a constant zero value is fed back and the control signal 50 has a value which could or could not trigger switching of the switching element 10. If the output 202 has a high logic value, the output 207 of the forward path of the delta-sigma modulator is fed back to the modulator through the feedback path and the control signal 50 has a variable value (±1) which either triggers or does not trigger switching of the switching element 10. In other words, if the signals 30 and 40 are not different or the sum of their high values is the same, a zero value is fed back and it is not important whether the quantizer 204 forces the signals IN1, IN2 to be switched. On the other hand, if the signals 30 and 40 are different or the sum of their high values is not the same, the value fed back depends on the output of the quantizer 204, so that the signals IN1, IN2 are switched if the output of the quantizer is +1 and are not switched if the output of the quantizer is −1, or vice versa. The signal traveling on the feedback path 208 is a digital ternary signal which can have a value which is either −1, 0, or +1. In other words, the digital signal on path 208 has three different levels. In view of the fact that a 1-bit signal has two levels (such as −1 and +1) and a 2-bit signal has four levels (such as −2, −1, 0, and 1), a signal having three levels, like the signal according to the present disclosure, can be presumed to be a '1.5 bit' signal.

Figure 4:
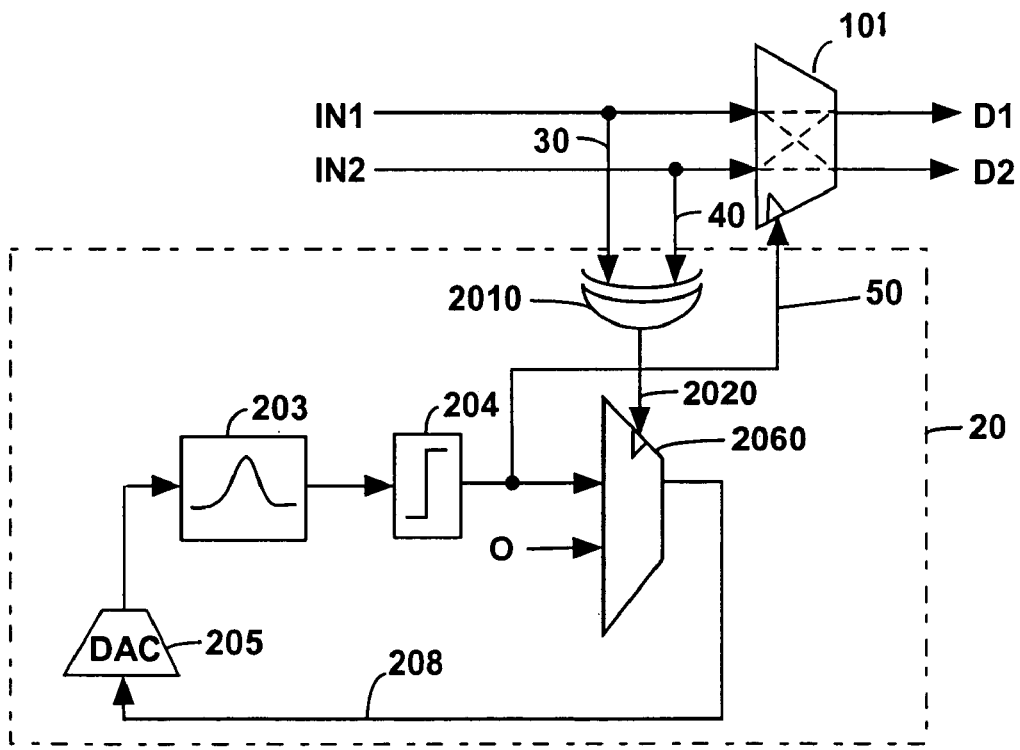
FIG. 4 shows the embodiment of FIG. 3 in better detail.

FIG. 4 shows the embodiment of FIG. 3 in better detail, where a XOR gate 2010 compares the inputs 30, 40 and a multiplexer 101 switches or does not switch the inputs in accordance with the value of signal 50. Preferably, the multiplexer 101 is a latched multiplexer. Additionally, the XOR output 2020 is fed into the delta-sigma modulator by means of a multiplexer 2060 controlled by the XOR output 2020. For example, if the input 30 is the same as input 40, the MUX 2060 presents a '0' value on, the path 208. If the input 30 is different from input 40, the MUX 2060 presents the output of quantizer 204 on the path 208, i.e. a ±1 value.

In this embodiment, the XOR output provides a high value when IN1=IN2. However, additional embodiments can be provided, where the a logic block provides a high value when Σ IN1(n)=Σ IN2(n), or when IN1·IN1=IN2·IN2 in case IN1 and IN2 are vectors. Further embodiments can also be provided, where the logic block provides a high value when the sum of the high values of IN1 equals the sum of the high values of IN2, as already discussed above.

The person skilled in the art will note that the XOR 2010 does not distinguish between the signals 30, 40 having values 0, 1 or values 1, 0. In both cases, the output 2020 of the XOR 2010 will be a high value. In order to avoid occurrence of cases where the difference between digital inputs 30, 40 can either be +1 or −1, digital inputs 30, 40 can be provided which are thermometer-coded. For example, a three-bit input will only be able to have values 111, 011, 001, 000. In this case, any difference between two inputs will never have, at the same time, both a +1 or a −1 value, like a difference between input 001 and non-thermometer-coded input 010 would, for example, have.

According to the present disclosure, the delta-sigma modulator is preferably implemented with mixed-signal circuitry with a tunable Q and a predefined center frequency. Therefore, while both the input and the output of each router or switching arrangement are digital, analog processing occurs inside the router, thus allowing a relatively-small number of transistors and high speeds.

Figure 5:
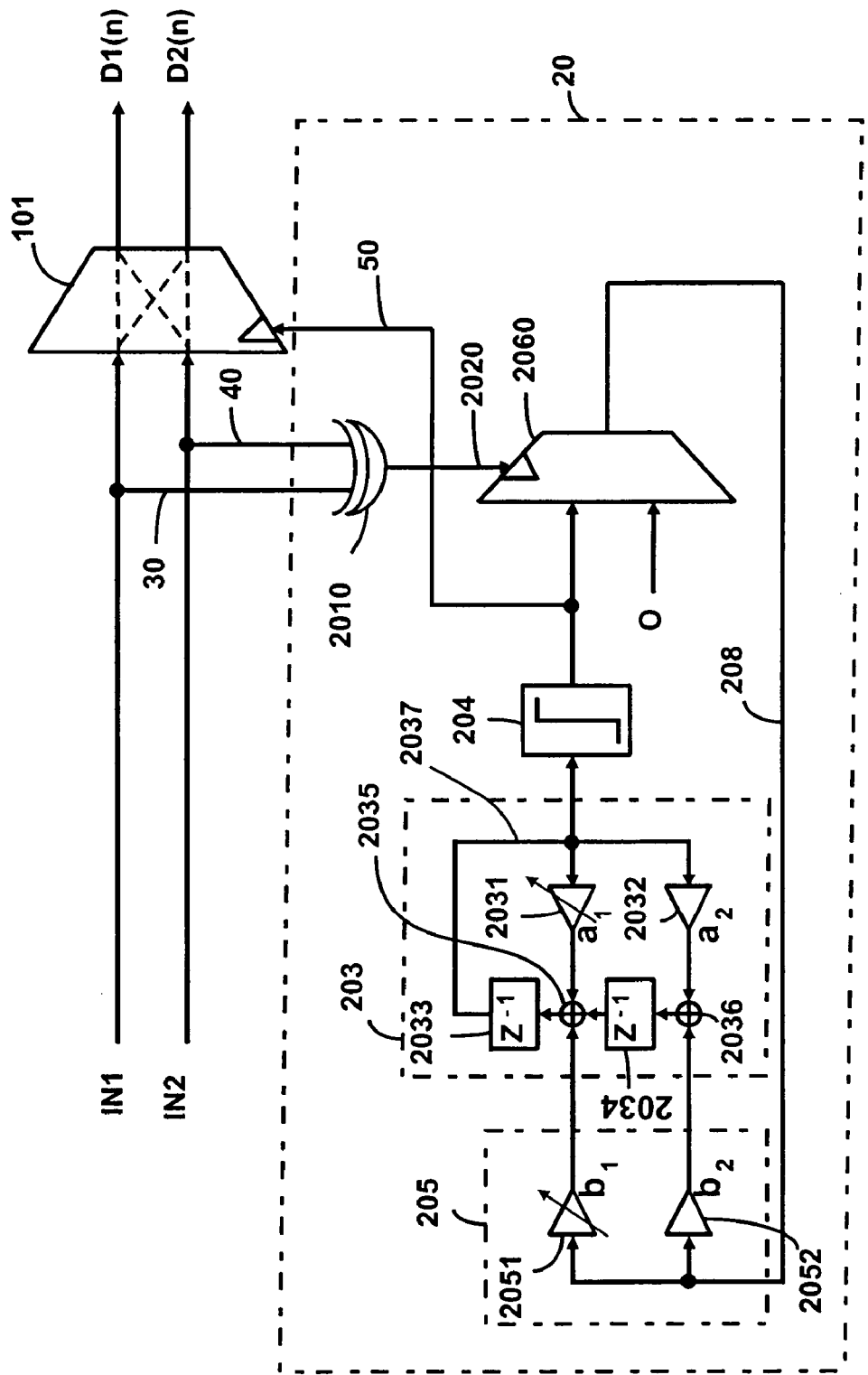
FIG. 5 shows a further embodiment of the control arrangement according to the present disclosure.

FIG. 5 shows an embodiment of the present disclosure where the DAC 205 is comprised of analog signal processing elements, such as a first variable amplifier element 2051 having a coefficient $b_1$ and a second amplifier element 2052 having a coefficient $b_2$. Further, the resonator 203 comprises a first variable amplifier element 2031 having a coefficient $a_1$ and a second amplifier element 2032 having a coefficient $a_2$. The resonator 203 also comprises a first delay element 2033 and a second delay element 2034, together with adders 2035, 2036. The first adder 2035 adds the output of the second delay element 2034 to the outputs of the amplifiers 2031 and 2051, and inputs the sum signal to the delay element 2033. The second adder 2036 adds the outputs of the amplifiers 2032 and 2052, and outputs the sum signal to the delay element 2034. The output 2037 of the first delay element is fed back to the amplifiers 2031, 2032. The output 2037 of the first delay element is also input to the quantizer 204.

Figure 6:
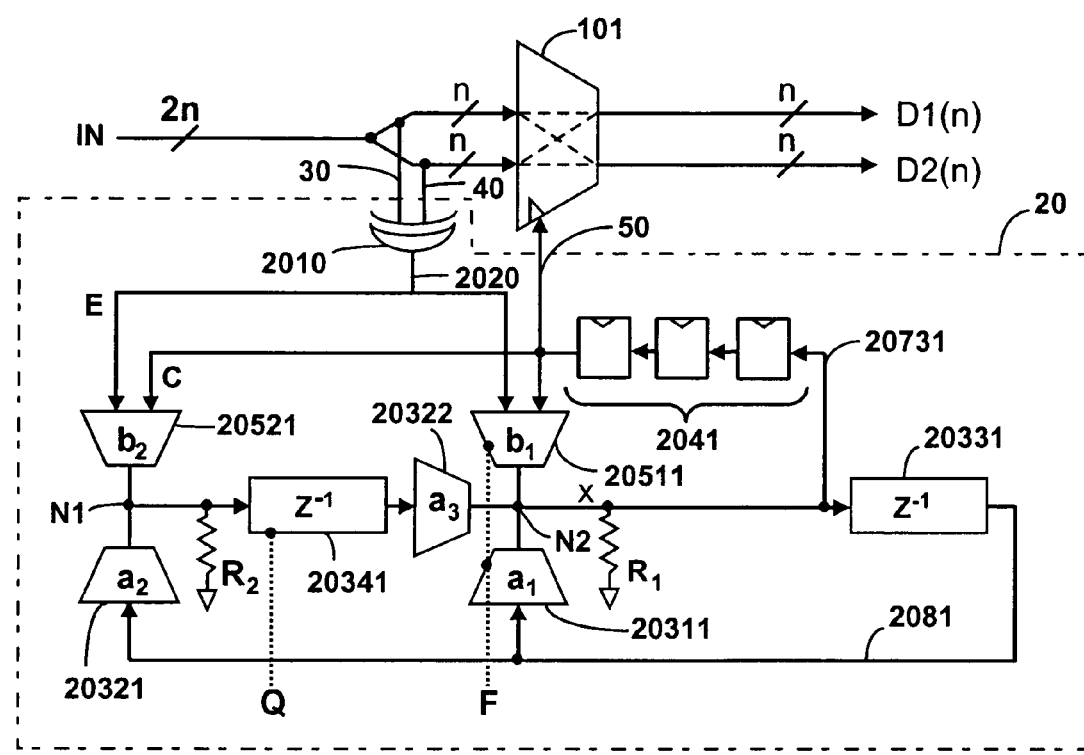
FIG. 6 shows an embodiment of an analog signal processing block in the switching arrangement.

FIG. 6 shows a further embodiment, where the two digital inputs 30, 40 are two digital n-bit inputs and are originated from a digital 2n-bit input. In this embodiment, the multiplexer 2060 of FIG. 4 has been incorporated into the transconductance amplifiers 20511 and 20521. Therefore, the output 2020 of XOR gate 2010 in input into amplifiers 20511 and 20521 along connection E. Additionally, the frequency F of amplifiers 20311 and 20511 can be controlled. Further, the Q factor of the delay element 20331 can be controlled. Preferably, the delay elements 20331 and 20341 are realized by means of track-and-hold amplifiers, as later shown. The inputs to the delay elements 20331 and 20341 are voltage values, while the outputs of the transconductance amplifiers 20311, 20511, 20321, 20521, and 20322 are current values. Addition is performed by merging transconductor currents arid converting the output into a voltage with resistors, such as resistors R1 and R2.

FIG. 6 also shows a transconductor element $a_3$, which has been introduced to allow a 'current' sum of the voltage output of the delay element 20341 with the current outputs of the $a_1$ and $b_1$ transconductor elements 20311, 20511.

The resonant frequency of the modulator is tuned by simultaneously tuning the gains of $a_1$ and $b_1$. The feedback coefficient $b_1$ is proportional to the resonant frequency set by $a_1$. Additional embodiments can be provided, where also the gain of $b_2$ is tuned. Consequently, a single external voltage source can be used to tune the DAC mismatch shaper between Fs/8 and 3Fs/8.

The function of the quantizer 204 of FIG. 5 is performed, in FIG. 6, by latch elements 2041, preferably three latch elements. In particular, the latch elements 2041 regenerate the analog value provided at their input 20371 to provide an output having one of two digital values, such as +1 and −1. For example, if the analog value at input 20371 is a negative value the output 50 will have a −1 value, and if the analog value at input 20371 is a positive value the output 50 will have a +1 value. As already mentioned above, the signal 50 represents the control or 'select' signal of the multiplexer 101. This signal has two possible values, either +1 or −1. Therefore, in a digital implementation, the select signal 50 could be found from the MSB of the output along connection 2081, given that the MSB of a positive number is 0 and the MSB of a negative number is 1. However, here the delay elements are implemented by means of analog signal processing circuits. To this effect, the three latch elements 2041 allow the speed of the modulator to be increased and the possibility of metastability in the select signal 50 to be decreased, by computing the sign function of the quantizer in parallel with the output of the delay element 20331.

In FIG. 6, some of the elements are clocked. In particular, the delay elements 20331 and 20341, the latches 2041, and the multiplexer 101 are clocked.

With reference to FIG. 6, it should be noted that some of the signals are digital signals and some other are analog signals. For example, the signals 50 and 2020 are digital signals, while the voltage signal at 2081 and the current signals summing at nodes N1 and N2 are analog signals.

The embodiment shown in FIGS. 3–6 is preferably used for a discrete-time bandpass mismatch shaping. However, the structure of FIG. 6 can be easily modified for either lowpass mismatch shaping or highpass mismatch shaping. For example, the resonator 203 can be replaced by an integrator to cause lowpass mismatch shaping, or a differentiator to cause highpass mismatch shaping. Additionally, while a discrete-time delta-sigma modulator is used in the preferred embodiment, the person skilled in the art will recognize that also a continuous-time delta-sigma modulator could be used.

Figures 7A, 7B:
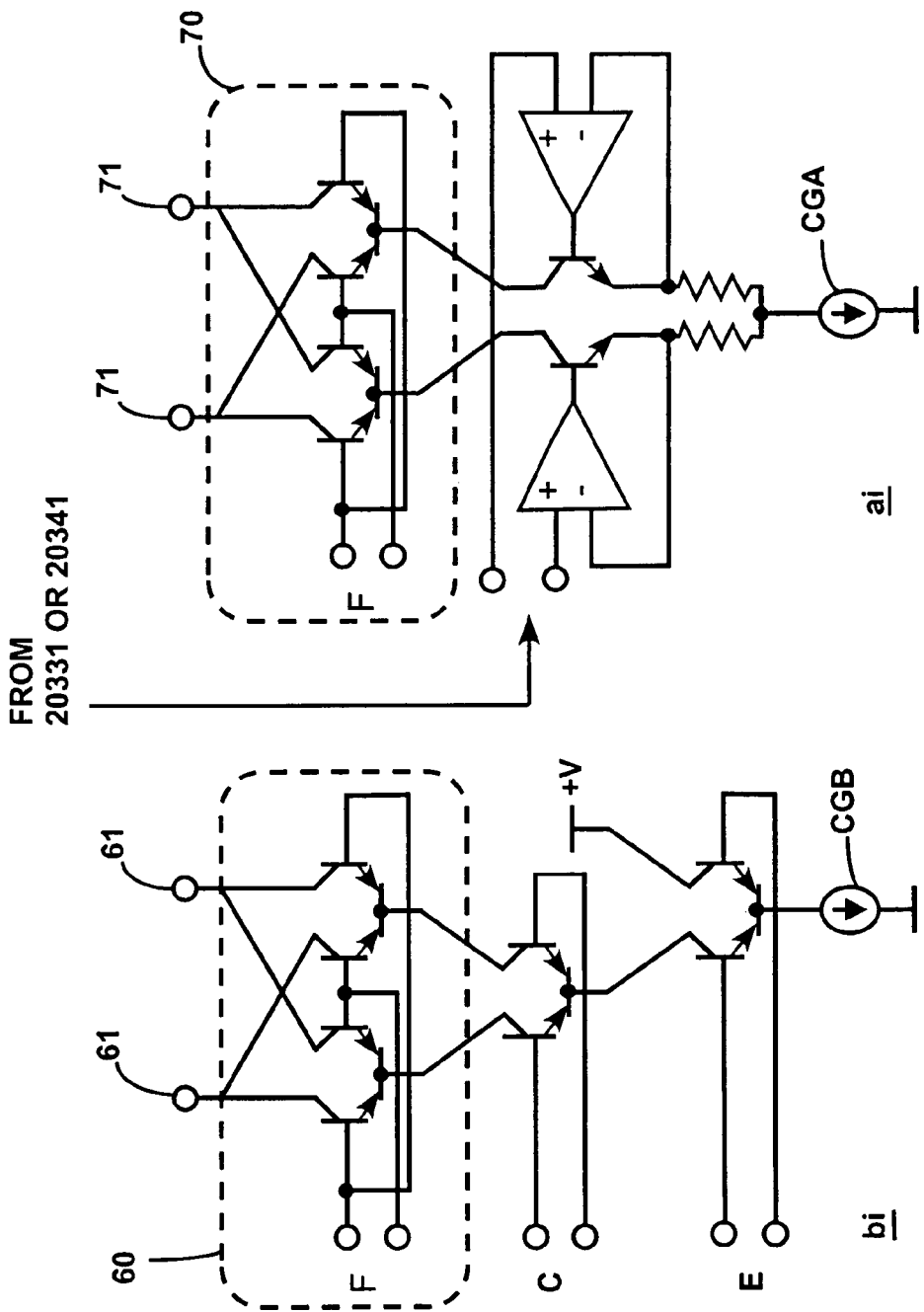
FIGS. 7A and 7B show a circuit implementation of the $a_i$ and $b_i$ cells of FIG. 6.

FIGS. 7A and 7B show a preferred structure of the transconductance amplifiers $b_i$ and $a_i$.

With reference to FIG. 7A, the preferred structure of a linear transconductor $b_i$ is shown. Each transconductor $b_i$ comprises a current generator CGB. If the input E (i.e. the output of XOR 2010) is low, the current generated by CGB is not transferred to the output 61, and a zero is fed back into the system. If the input E is high, the current generated by CGB is transferred to the output 61. The sign of the input C (i.e. the ±1 output of the quantizer) determines the sign of the gain $b_i$. If C is +1, the gain will be $+b_i$. If C is −1, the gain will be $−b_i$. The upper stage 60 (Gilbert cell) is only present in cell $b_1$ and allows tuning of the cell $b_1$. It should be noted that the Gilbert cell 60 adds base-collector capacitances to the load at point x in FIG. 6. This is the reason for which gain tuning is preferably separated from this node and moved into delay element 20331 of FIG. 6. Additionally, the linear transconductors $a_i$ use voltage feedback to the input transistors in order to reduce the dependence of the output on VBE and VCE.

With reference to FIG. 7B, the preferred structure of a linear transconductor $a_i$ is shown. Each transconductor $a_i$ comprises a current generator CGA. The output of the delay elements 20331 or 20341 shown in FIG. 6 is an analog value and is input into the transconductors ai. For example, with reference to FIG. 6, the output of delay element 20331 is input into transconductors $a_1$ and $a_2$, and the output of delay element 20341 is input into transconductor $a_3$. The output of the transconductors $a_i$ will have a value corresponding to the product between the analog output value of the delay elements 20331 or 20341 and the gain $a_i$. The upper stage 70 is only present in cell $a_1$ and allows tuning of the cell $a_1$, similarly to what disclosed with reference to cell $b_i$. For a reference to $a_1$ cells see, for example, Behzad Razavi, "Design of Analog Integrated Circuits, Preview Edition", McGraw-Hill 2001, p. 309–310.

Figure 8:
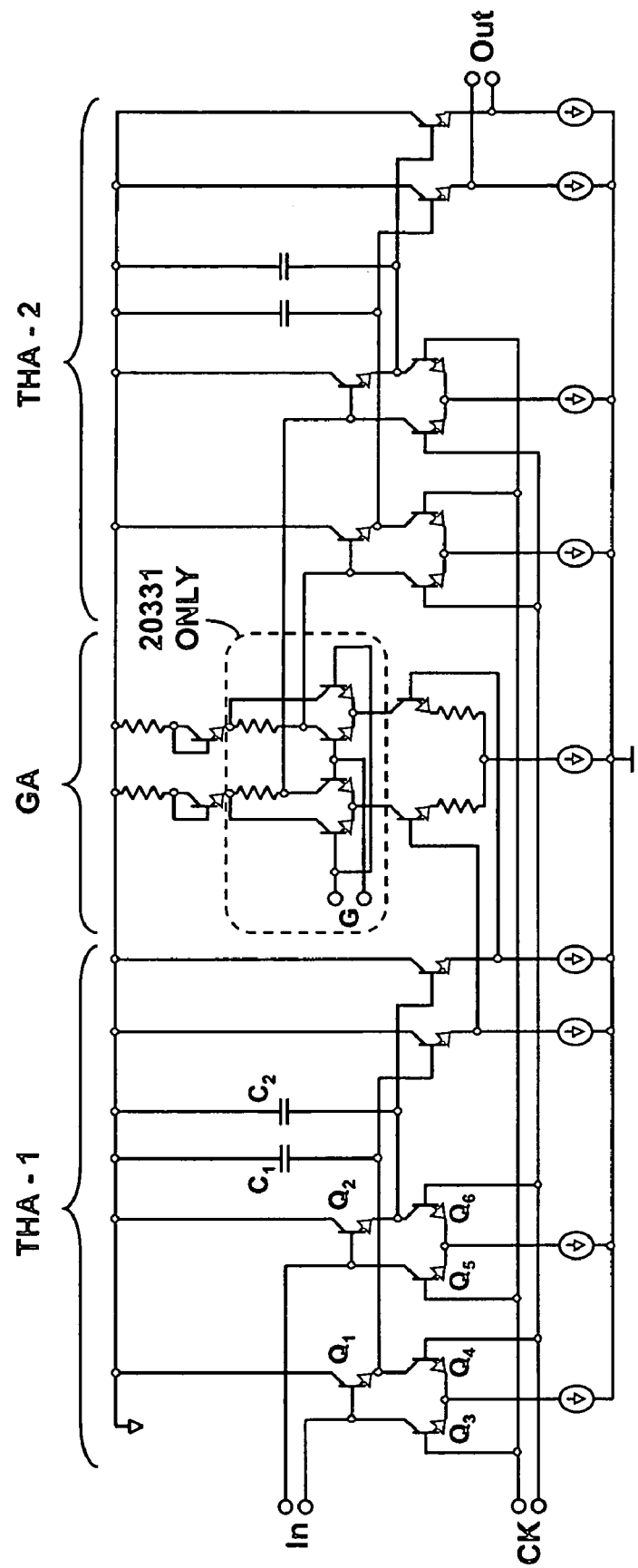
FIG. 8 shows an embodiment of the delay cells shown in FIG. 6.

FIG. 8 shows a preferred embodiment of the analog delay element 20331 or 20341 of FIG. 6. The delay element comprises two switched emitter follower track-and-hold amplifiers (THA-1 and THA-2) and an amplifier GA between THA-1 and THA-2. Normally, the first switched emitter follower is preceded by a unity-gain amplifier with a resistive load as shown, for example, in P. Vorenkamp at al., "Fully Bipolar, 130-Msample/s 10-b Track-and-Hold Circuit", IEEE JSSC, vol. 27, no. 7, pp. 988–992, 1992. In particular, the resistive load is used to turn off the transistors Q1 and Q2 of THA-1 feeding the hold capacitors C1 and C2 as the transistors Q3, Q4, Q5 and Q6 switch. However, resistor loads are already available before the delay elements, as shown by resistors R1 and R2 in FIG. 6. With these resistive loads available, additional unity gain amplifiers only add propagation delay, noise and nonlinearity. Therefore, such unity-gain amplifier is not needed in FIG. 8. The amplifier GA, however, is necessary to transfer the voltages from THA-1 to THA-2. According to a preferred embodiment of the present disclosure, the amplifier GA of delay element 20341 is a unity-gain amplifier, while the amplifier GA of delay element 20331 is a variable-gain amplifier, where the gain can be varied, for example by ±10%, by means of the input G. The gain trimming allows the user to adjust the Q of the resonator. As already pointed out with reference to the detailed description of FIG. 6, the delay elements 20331 and 20341 can be clocked. FIG. 8 takes into account this embodiment by means of a clock input CK.

FIGS. 9–18 show an application of the switching arrangement shown in FIGS. 1–8 to a digital-to-analog converter (DAC) mismatch shaper. In accordance with the present disclosure, the shaper can be a pipelined DAC mismatch shaper and/or a tunable DAC-mismatch shaper.

Linearized multi-bit DACs that can generate IF or RF signals have many applications in direct, signal synthesis and multi-bit delta-sigma modulation. Mismatch shapers are attractive for linearization because they can shape static and dynamic DAC mismatch errors away from a frequency of interest for a wide variety of DAC architectures, technologies and types of mismatches. However, mismatch-shaping circuitry is slow in linearizing direct-IF generating DACs. Due to the algorithmic complexity and resultant critical path delays, the currently published fastest mismatch shaped DACs can only generate signals at or below 2 MHz.

Figure 9:
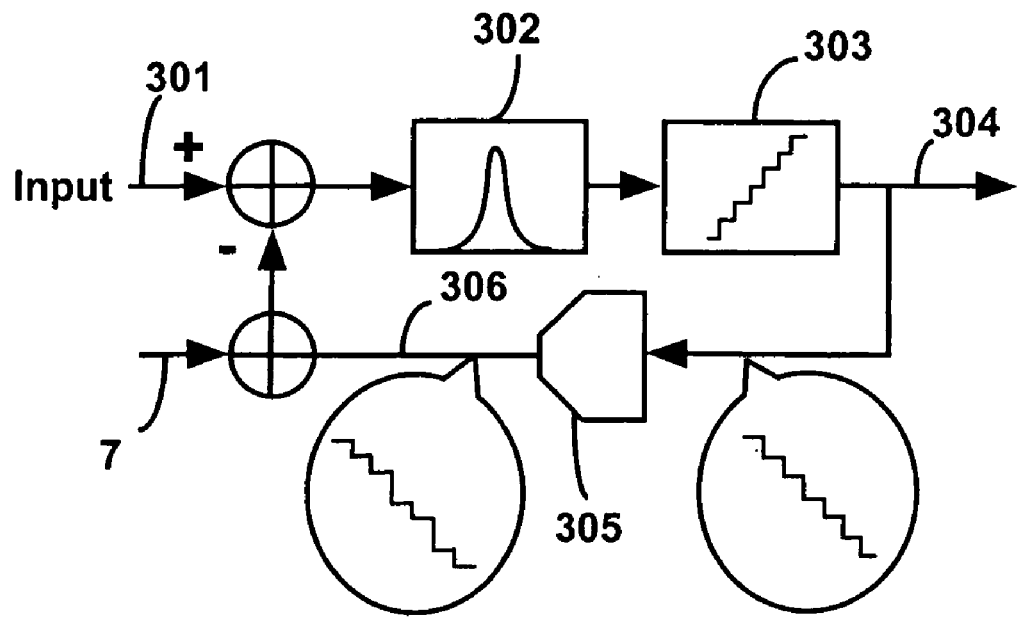
FIG. 9 shows a prior art multi-bit delta-sigma modulator.

FIG. 9 shows a multi-bit delta-sigma modulator for analog-to-digital conversion, which is one application for a DAC mismatch shaper. A delta-sigma modulator digitizes an analog input signal 301 by means of resonators 302 and a multi-bit analog-to-digital converter 303, converts the digitized output 304 back into a multi-bit digital-to-analog converter (DAC) 305, and feeds the DAC analog output 306 back to the input. Essentially, the delta-sigma modulator uses feedback to reduce quantization errors. However, if the DAC 305 is nonlinear, the DAC 305 limits the performance of the delta-sigma modulator, and a DAC mismatch error 307 is introduced in the modulator.

Figure 10:
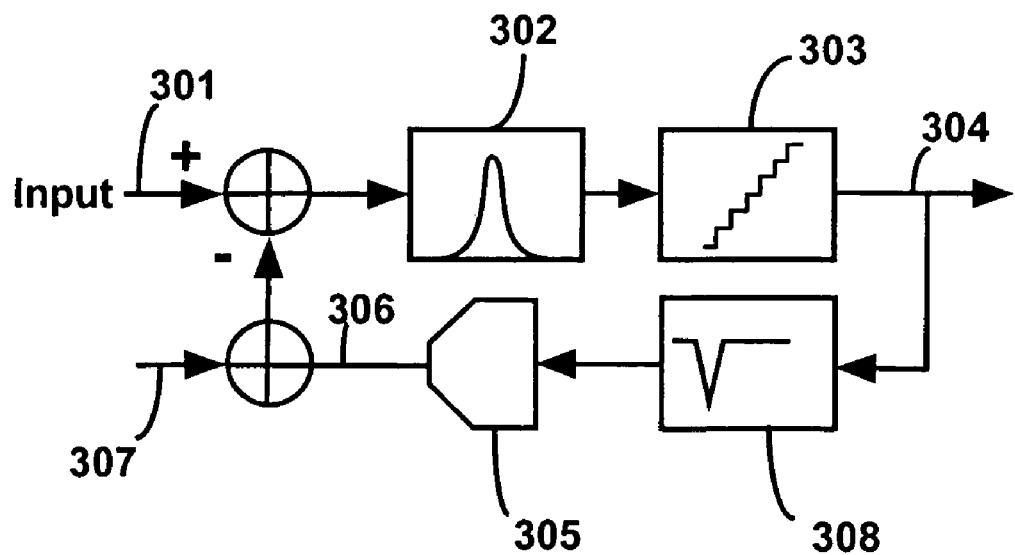
FIG. 10 shows the delta-sigma modulator of FIG. 8, further comprising a DAC shaper.

FIG. 10 shows the delta-sigma modulator of FIG. 9, further comprising a DAC mismatch shaper 308. The mismatch shaper 308 is a logic block that has the ability of shaping the DAC mismatch error 307 away from the frequency of interest.

Figure 11A:
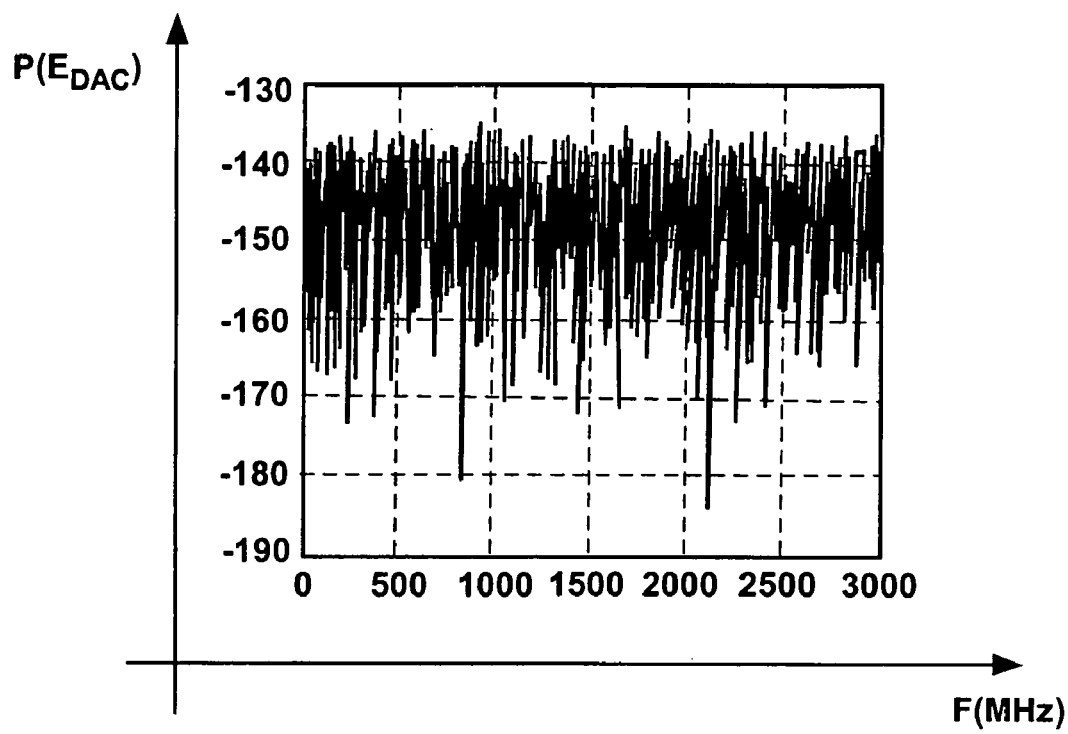
FIG. 11A shows the spectrum of DAC mismatch errors without the DAC shaper of FIG. 9.
Figure 11B:
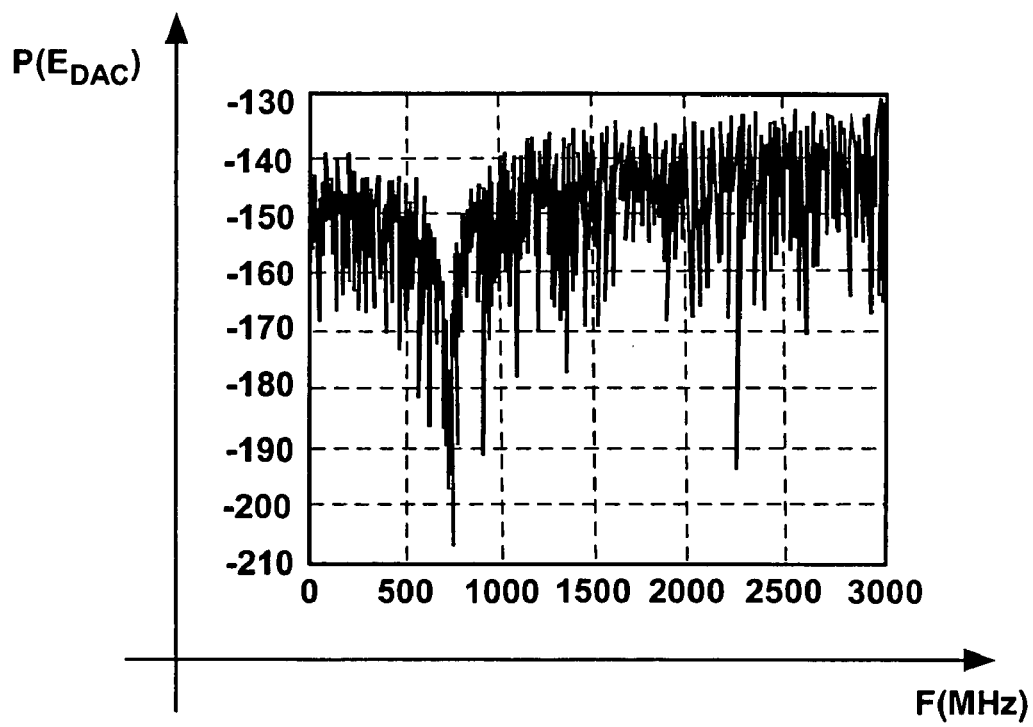
FIG. 11B shows the spectrum of DAC mismatch errors with the shaper of FIG. 10.

FIG. 11A shows the spectrum of DAC mismatch errors $P(E_{DAC})$ without the DAC shaper of FIG. 10. FIG. 11B shows the spectrum of DAC mismatch errors with the shaper of FIG. 10. Therefore, mismatch shapers can shape static and dynamic DAC mismatch errors away from a frequency of interest for a wide variety of DAC architectures, technologies and types of mismatches.

A mismatch shaper is a block that performs computations. These computations introduce delays into the feedback loop. These delays lead to a decreased signal-to-noise ratio (SNR) and a decreased stability of the feedback loop. To overcome this problem, DAC mismatch shapers have been designed to finish computing in a fraction of a clock cycle. As a consequence, the clocks in DAC systems comprising mismatch shapers need to be very slow. Due to the algorithmic complexity and resultant critical path delays, the fastest bandpass mismatch shaped DACs can only generate signals at or below 2 MHz. See, for example, L. Hernandez, A. Quesada, "Programmable Sine Wave Generator Employing a Mismatch-Shaping DAC," ICECS Dig. Tech. Papers, 1998, pp. 135–138. Therefore, there is a need for an improved DAC mismatch shaper.

Figure 12:
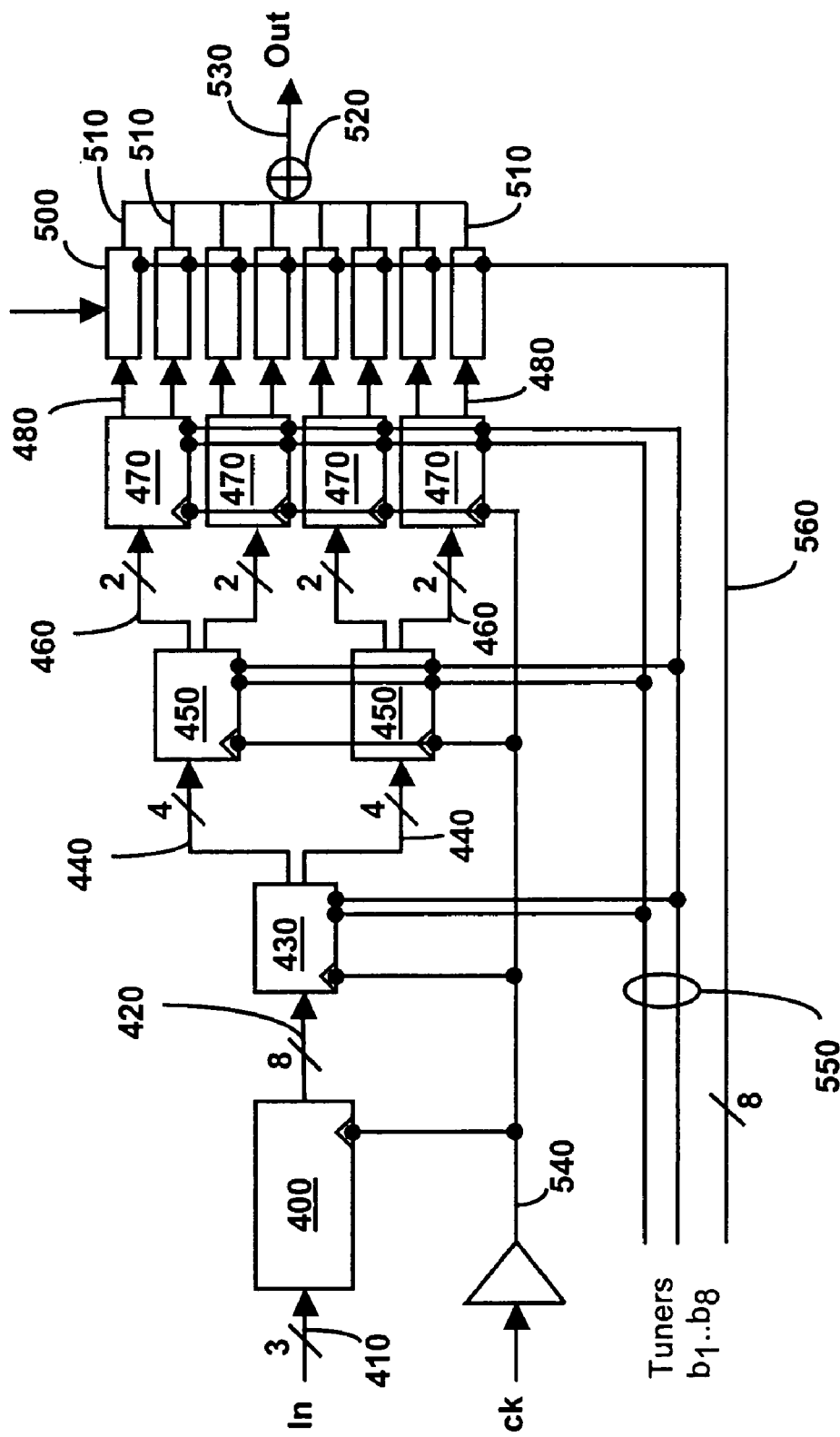
FIG. 12 shows an embodiment of the architecture for the DAC according to the present disclosure.

FIG. 12 shows an embodiment of the architecture for the DAC according to the present disclosure. For simplicity, a 3-bit version is shown, but the topology and all of the results are easily generalized to any number of bits.

The architecture shown in FIG. 12 represents an improved combination of the elements 305 (DAC) and 308 (shaper) of FIG. 9. A decoder 400 converts a 3-bit input 410 into a thermometer code 420. The input 410 corresponds to the beginning of the feedback loop of FIGS. 9 and 10, where the output signal 304 is fed back. Turning to FIG. 12, each one of the eight bits 420 is then routed to an individual DAC 500 using, for example, a tree-structured routing architecture, as disclosed in U.S. Pat. No. 5,684,482 to Galton. The thermometer code 420 is input to a first-level router or switching arrangement 430 as a sequence of eight bits, comprising unsigned 7-bit integers and an eighth bit which is always low. In particular, since eight DACs 500 are used where only seven levels are required, the decoder 400 introduces an additional signal which is always low. Each output of the router 430 comprises four bits, as shown by lines 440. Each four-bit output is input into a second-level router 450, which performs substantially the same operation of the previous router 430. Each output of the routers 450 comprises two bits, as shown by lines 460. Each two-bit output 460 is input into a third-level router 470, which performs substantially the same operation of the previous routers. Each output of the routers 470 comprises one bit, as shown by lines 480. Each one-bit output 480 is input into one of the one-bit DACs 500. Each output 510 of the one-bit DACs 500 is input to an adder 520 which sums the outputs 510 to create an analog signal 530.

According to the present disclosure, each router or switching arrangement or block is implemented in accordance with one of the embodiments shown in FIGS. 1–6, preferably the embodiment of FIG. 6.

According to the present disclosure, pipelining is employed in each router 430, 450, 470 to eliminate the dependence of the delay on the number of bits. In FIG. 12, pipelining is shown by a clock signal 540 which is input into each of the routers. With reference to the embodiment shown in FIG. 6, for example, the clock signal 540 will be input into the multiplexer 101 and the latches 2041.

Additionally, an external tuning 550 tunes the routers so as to shape the DAC errors away from a desired frequency band. With reference to the embodiment shown in FIG. 6; for example, tuning is performed by the signals Q and F. In particular, F tunes the position of the notch in the DAC errors, while Q improves the notch depth.

Moreover, each DAC has an individual current control 560. The current control 560 artificially introduces DAC mismatches, thus testing the effectiveness of the mismatch shaping operation. A possible example of a DAC to be used in accordance with the present disclosure can be found in one of the papers [1]–[8] discussed in paragraph [0061] of the present disclosure.

While FIG. 12 shows a tree-based structure, the teachings of the present disclosure can be applied to a variety of mismatch shapers, for example data-weighted averaging, as shown in Y. Sakina, "Multi-bit sigma-delta Analog-to-Digital Converters with Nonlinearity Correction using Dynamic Barrel Shifting," Electronics Research Laboratory, College of Engineering, University of California, Berkeley Calif., Memorandum No. UCB/ERL M93/63, 1993 or in Yong-In Park, S. Karthikeyan, Wern Ming Koe, Zhongnong Jiang and Tiak-Chean Tan, "A 16-Bit, 5 MHz Multi-Bit Sigma-Delta ADC Using Adaptively Randomized DWA," Proceedings of the Custom Integrated Circuits Conference (CICC), 2003, pp. 115–118. Also vector-feedback mismatch shaping can be used, as shown in R. Schreier and B. Zhang, "Noise-shaped multibit D/A converter employing unit elements," Electronic Letters, vol. 31, no. 20, pp. 1712–1713, September 1995.

Figure 13:
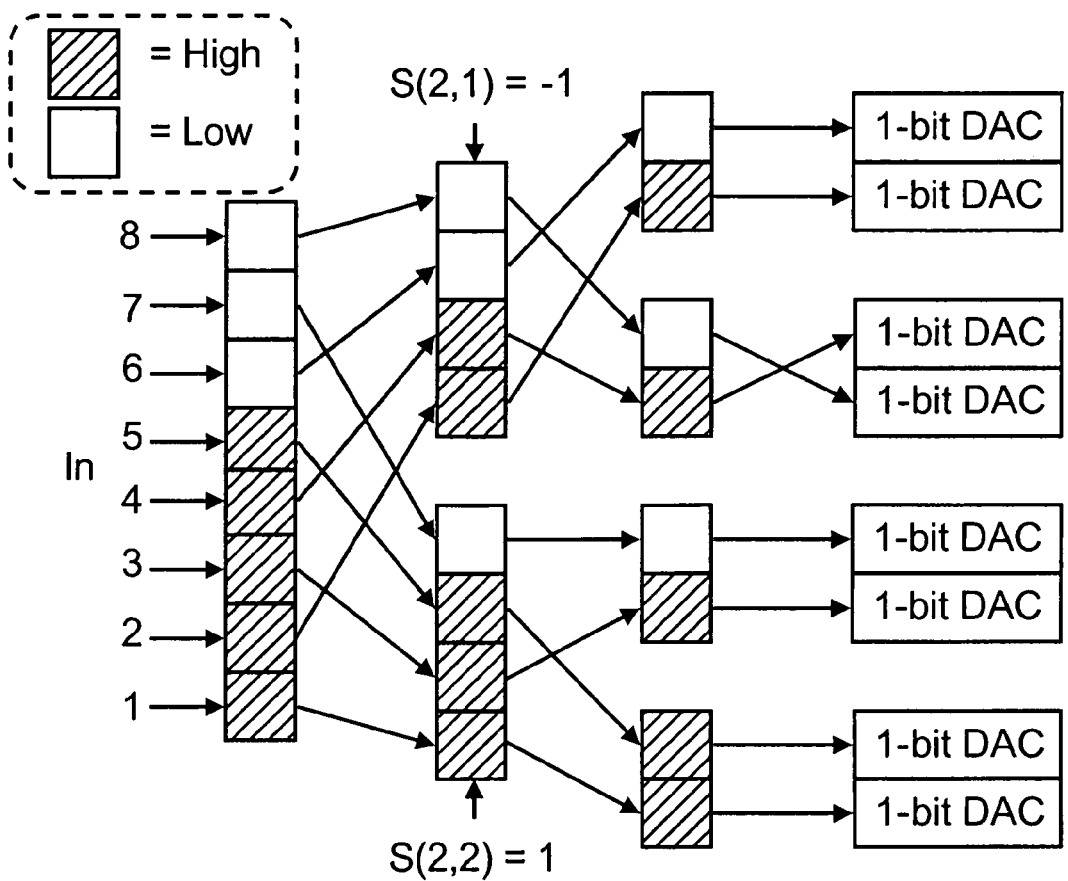
FIG. 13 shows a possible way of operation of the architecture of FIG. 12.
Figure 14:
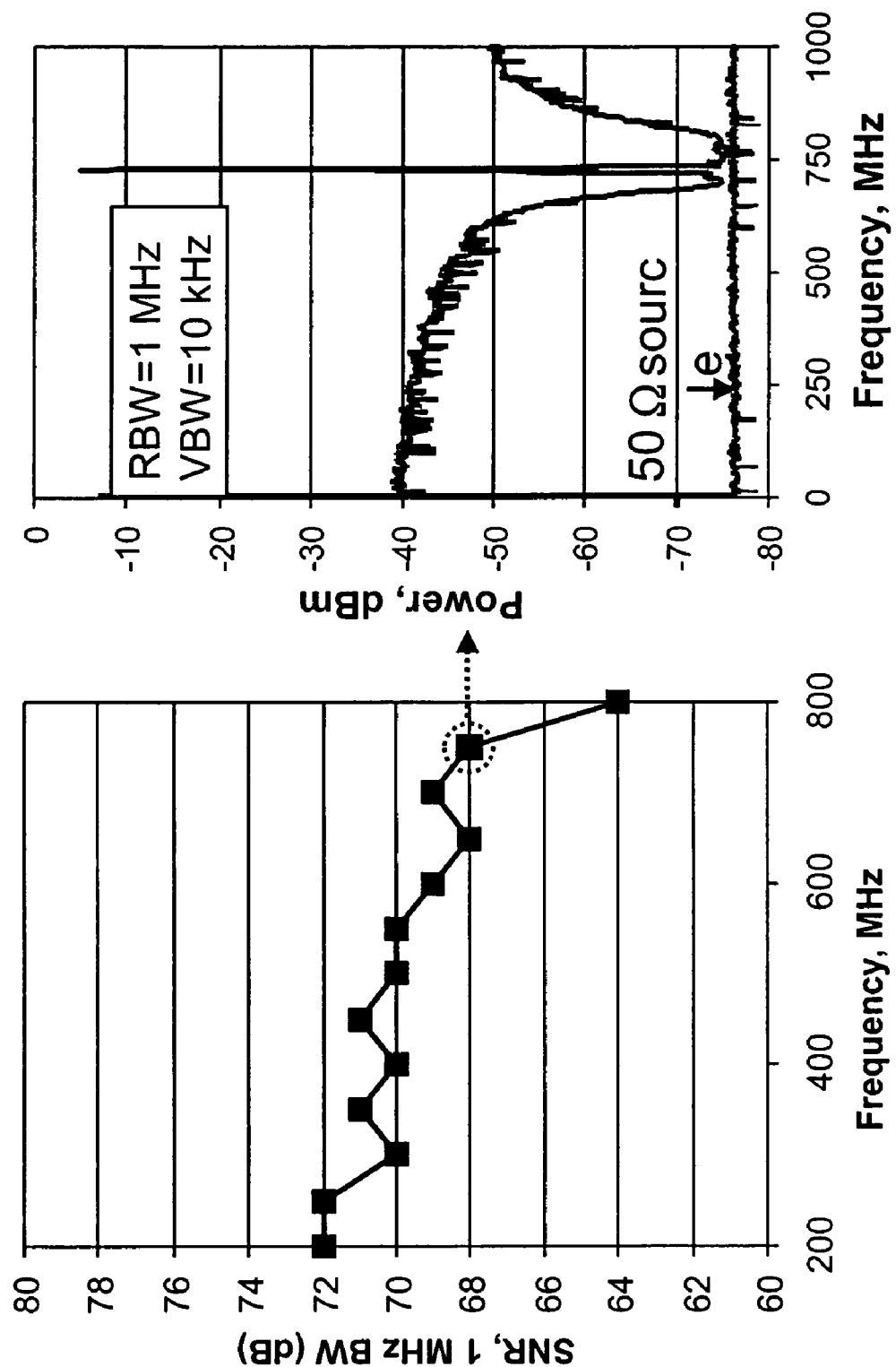
FIG. 14 shows a graph where measured SNR improvement vs. output frequency in the device according to the present disclosure is depicted.

FIG. 13 shows a snapshot of a routing scheme for the 3-bit embodiment of FIG. 12 at a given time nT. In particular, FIG. 13 shows how a routing preserving the fact that the inputs to each router are thermometer-coded can be performed. Reference to routing schemes can be made, for example, to U.S. Pat. No. 5,684,482 to Galton.

A chip incorporating a delta-sigma modulator with the DAC according to the present disclosure was fabricated in an InP heterojunction bipolar transistor (HBT) of the type shown in M. Sokolich et al., "A low-power 72.8-GHz static frequency divider in AlInAs/InGaAs HBT technology," IEEE JSSC, vol. 36, no. 9, pp. 1328–1334, September 2001.

To test the performance of the above-described 3-bit DAC shaper of FIG. 12, a repeating 3-bit $6^{th}$-order delta-sigma-modulated pattern was fed in from a pattern generator. Because a true delta-sigma-modulated pattern does not repeat, the repeating pattern introduces a substantial amount of noise that limits the SNR to 78 dB in a 1 MHz BW.

Additionally, the spectrum analyzer's noise floor was 1–2 dB below the signal's noise floor. This is reflected in FIG. 14, which shows the output pattern into a spectrum analyzer, Resolution Bandwidth RBW=1 MHz, Video Bandwidth=10 MHz, alongside the noise floor of a 50-ohm source. The SNR was >68 dB in 1 MHz bandwidth up to 750 MHz IF, and is measurement-limited.

Figure 15:
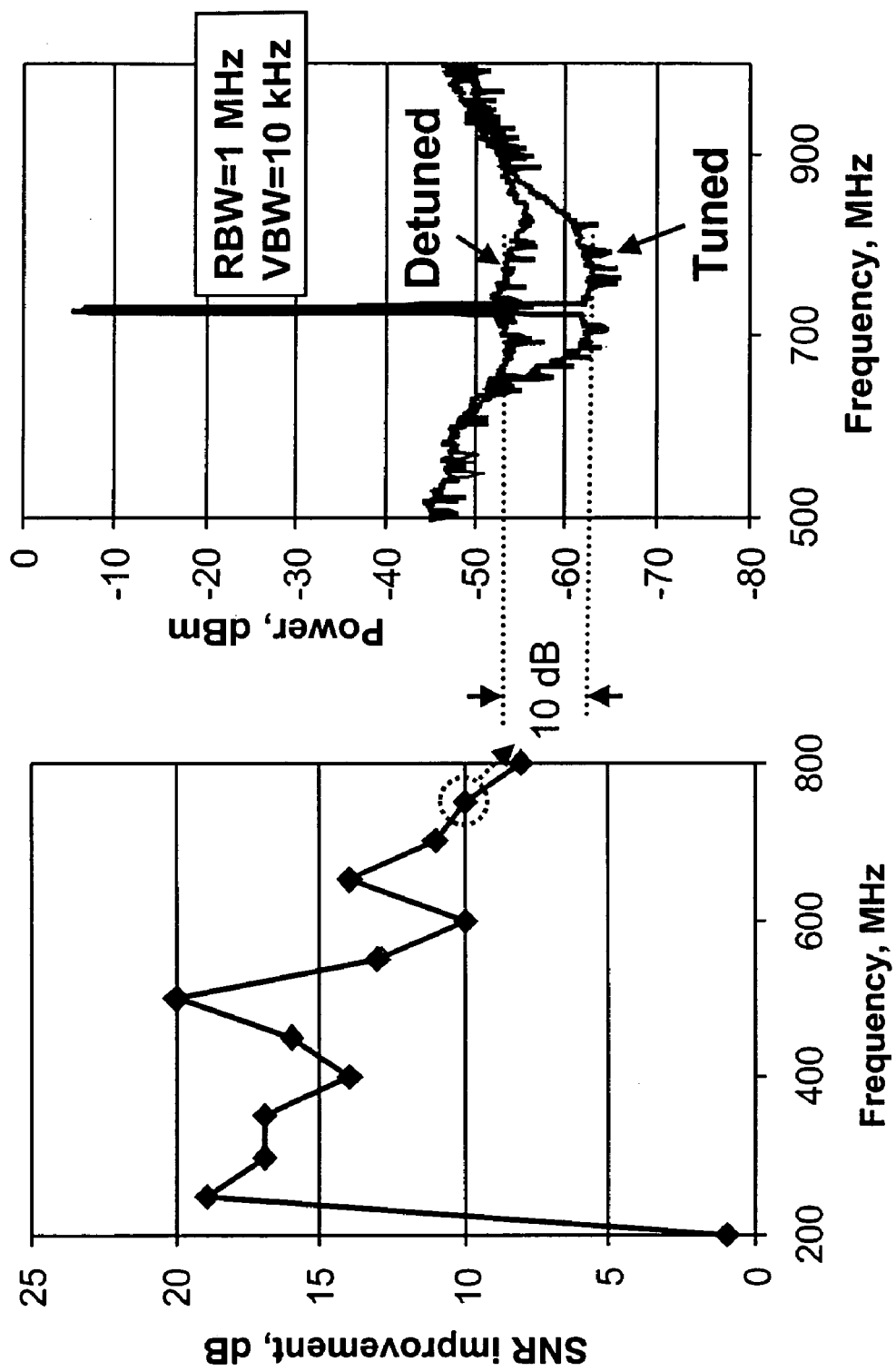
FIG. 15 shows a graph where measured SNR improvement vs. input frequency in the device according to the present disclosure is depicted.

When the DACs were deliberately mismatched, as shown in FIG. 15, the effect of mismatching became evident. With approximately +/−10% current mismatches between the DAC elements, tuning the mismatch shaper improved the SNR between 10–20 dB for frequencies between 250–750 MHz.

Figure 16:
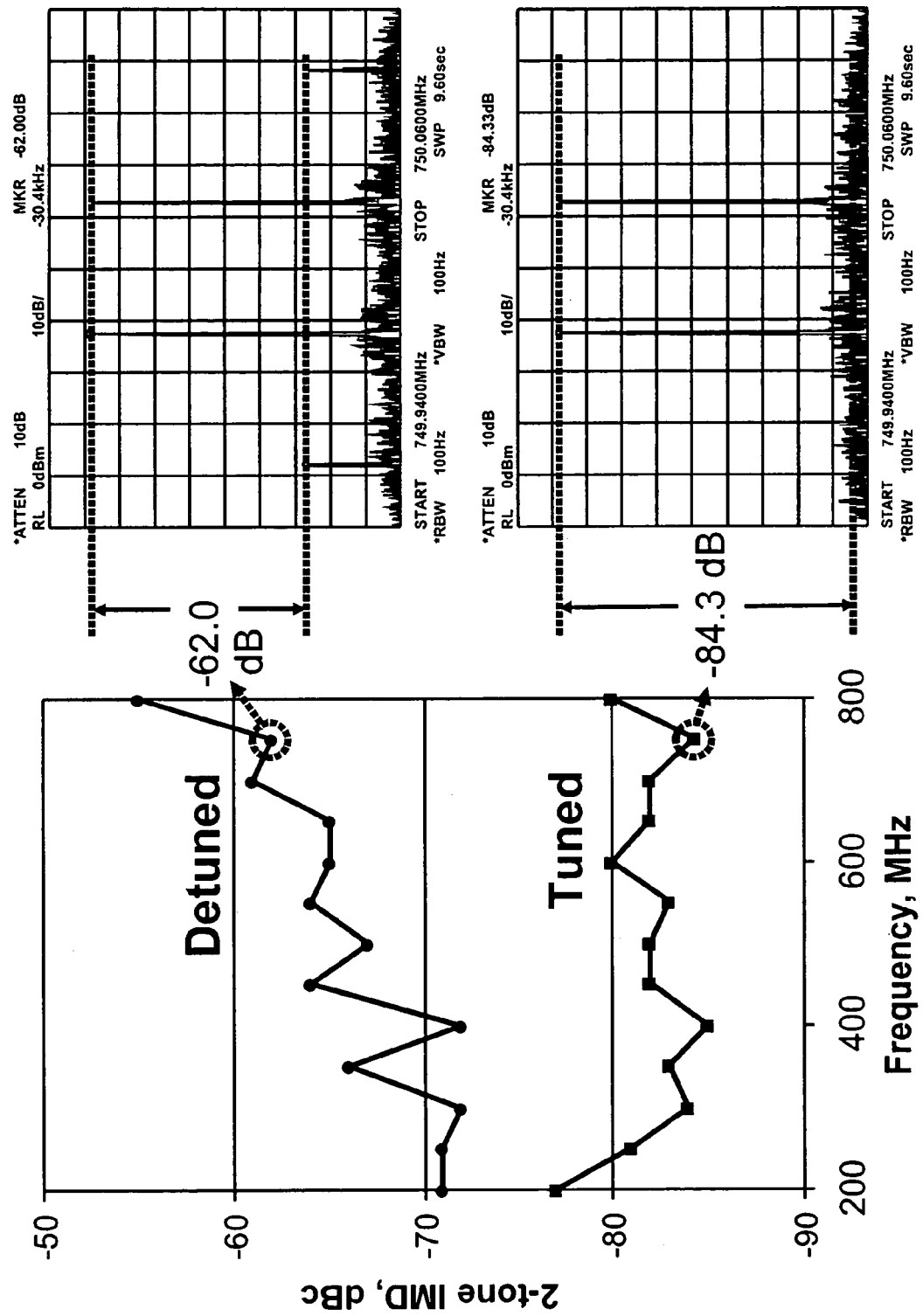
FIG. 16 shows a graph where intermodulation distortion in the device according to the present disclosure is depicted.

The intermodulation was measured using two −6 dBFS signals from 200 to 800 MHz. The resultant output spectrum at 750 MHz IF is shown in FIG. 16. The third harmonic is −62 dBc when the mismatch shaper is untuned, and is −84.3 dBc when the mismatch shaper is tuned to 750 MHz. The intermodulation for the untuned shaper rapidly increases with increasing IF, from −72 dBc to −61 dBc. The relatively low intermodulation distortion at low frequencies shows the randomizing nature of the mismatch shaper, even if the shaper is untuned. However, the increase in intermodulation distortion at higher frequencies suggests that dynamic errors are becoming dominant at higher IF's. Dynamic errors, such as those caused by timing mismatches, can actually be exacerbated by randomization because the number of switching events increases. However, the intermodulation distortion is consistently lower than −80 dBc when the mismatch shaper is tuned. This shows that the DAC mismatch shaper can also shape these dynamic errors. The SFDR (spurious-free dynamic range) was more than 74 dBc in a 100 MHz bandwidth in the same frequency range.

Figure 17:
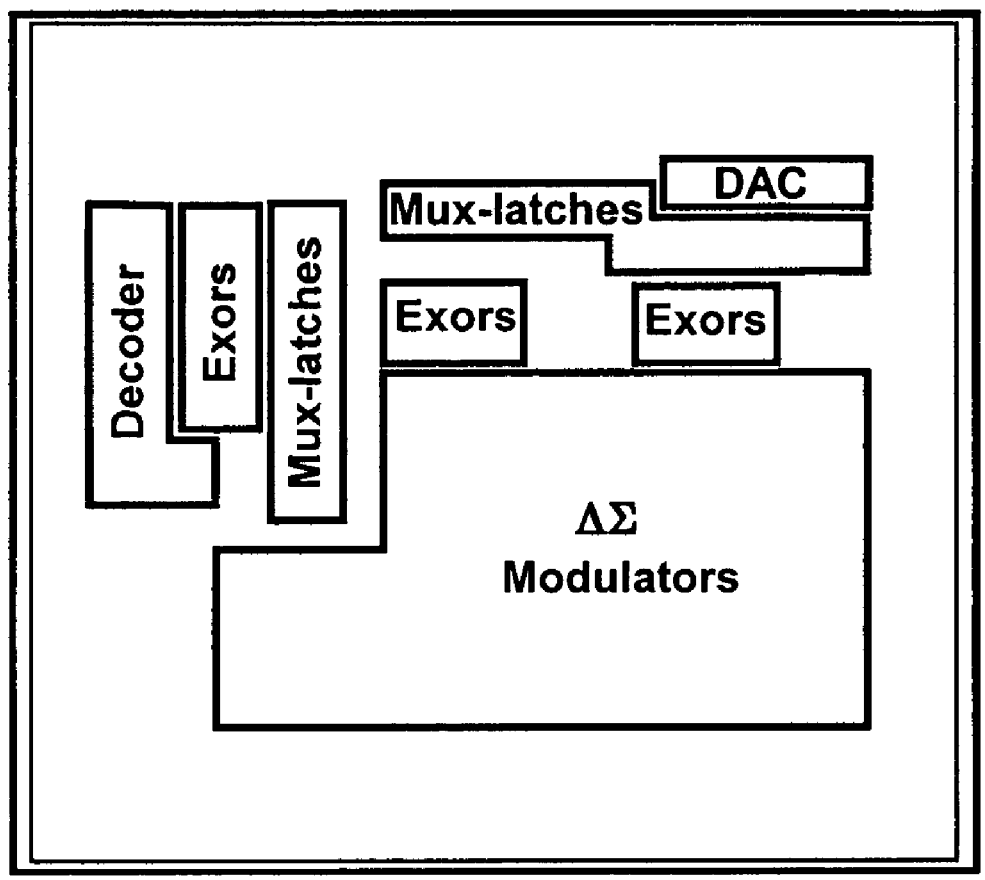
FIG. 17 shows a representation of a die photo with the elements of the delta-sigma modulator according to the present disclosure.

A graphical representation of a die photo is shown in FIG. 17. The mux-latches are placed near the top of the chip to allow easy access to their inputs and outputs. The seven delta-sigma modulators of the embodiment of FIG. 12 are arranged so as to minimize the maximum interconnect length from the signals to the delta-sigma modulator. As already explained above, the chip was fabricated in an InP heterojunction bipolar transistor (HBT) of the type shown in M. Sokolich et al., "A low-power, 72.8-Ghz static frequency divider in AlInAs/InGaAs HBT technology," IEEE JSSC, vol. 36, no. 9, pp. 1328–1334, September 2001. Tested transistors had an ft and fmax of 150 GHz, with a minimum transistor area of 1 µm×1 µm. The die size is 3.2 mm×2.8 mm. The chip used 3800 transistors.

Figure 18:
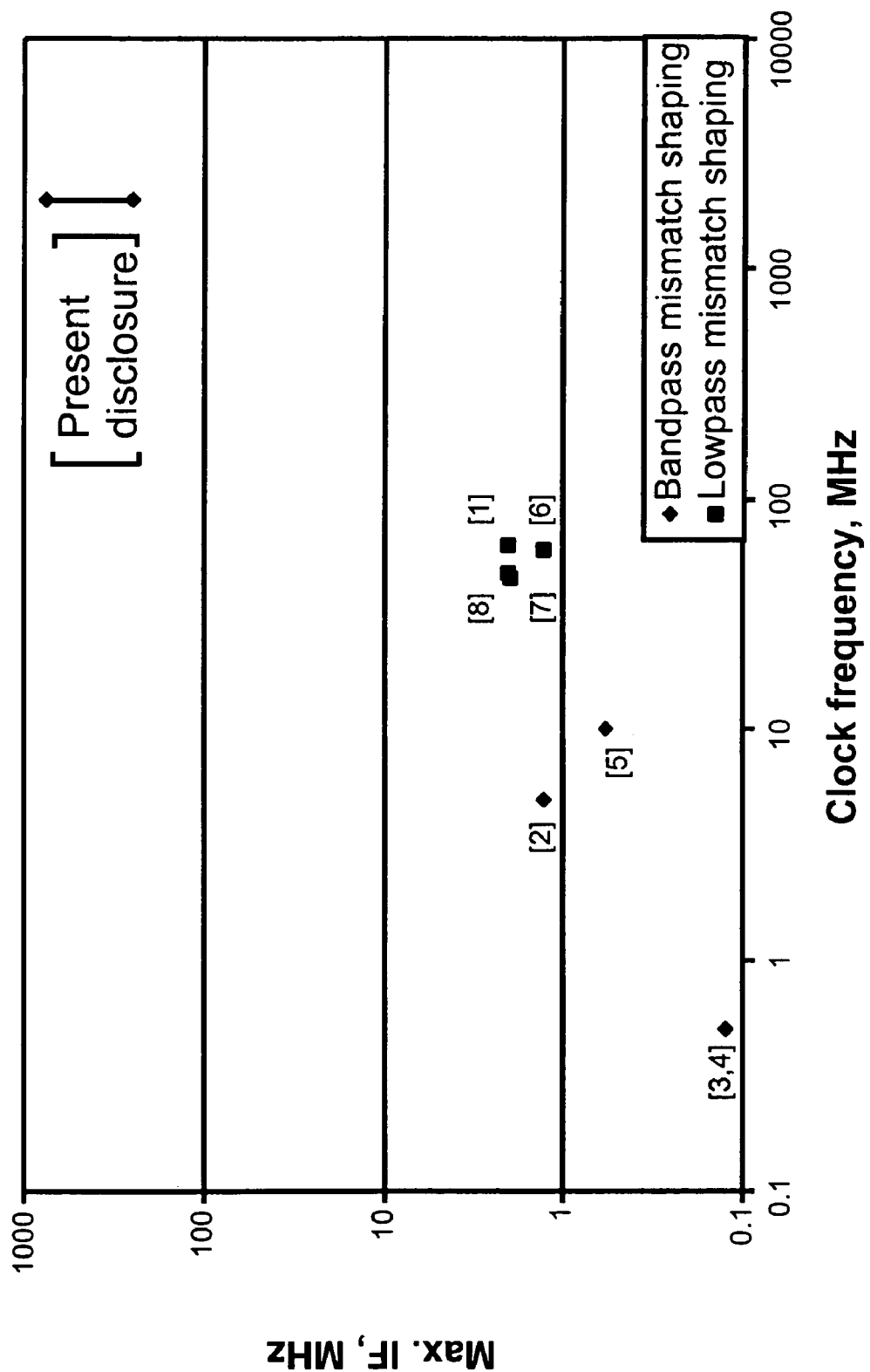
FIG. 18 shows a comparison between the delta-sigma modulator according to the present disclosure and prior art delta-sigma modulators.

The comparison with the state of the art is shown in FIG. 18. The numbers represented in square brackets in FIG. 18 correspond to the following references:

[1] Katelijn Vleugels, Shahriar Rabii, Bruce Wooley, "A 2.5-V Sigma-Delta Modulator for Broadband Communications Applications," IEEE JSSC, vol. 36, no. 12, December 2001.

[2] L. Hernandez, A. Quesada, "Programmable Sine Wave Generator Employing a Mismatch-Shaping DAC," ICECS Dig. Tech. Papers, 1998, pp. 135–138.

[3] T. Shui et al, "Mismatch Shaping for a Current-Mode Multibit Delta-Sigma DAC," IEEE JSSC, vol. 34, no. 3, pp. 331–338, March 1999.

[4] H. Lin et al, "A Bandpass Mismatch-Shaped Multi-Bit DS Switched-Capacitor DAC using Butterfly Shuffler," ISSCC Digest of Technical Papers, 1999.

[5] T. Ueno et. Al, "A Fourth-Order Bandpass D-S Modulator Using Second-Order Bandpass Noise-Shaping Dynamic Element Matching," IEEE JSSC, vol. 37, no. 7, pp. 809–816, June 2002.

[6] Yves Geerts, Michiel Steyaert, Willy Sansen, "A 2.5 MSample/s Multi-Bit DS CMOS ADC," ISSCC Digest of Technical Papers, 2000.

[7] Tai-Haur Kuo, Kuan-Dar Chen, and Horng-Ru Yeng, "A Wideband CMOS Sigma-Delta Modulator with Incremental Data Weighted Averaging," IEEE JSSC, vol. 37, no. 1, January 2002, pp. 11–17.

[8] Matthew Miller and Craig S. Petrie, "A Multibit Sigma-Delta ADC for Multimode Receivers," IEEE JSSC, vol. 38, no. 3, March 2003.

The mismatch shaper according to the present disclosure has over 30× the clock speed, and generates over 300× the IF of any published mismatch-shaped DAC. In the preferred embodiment according to the present disclosure, the mismatch shaper is a bandpass mismatch shaper. When compared with prior art bandpass mismatch shapers, it has 200× the clock speed and generates over 600× the IF of any bandpass mismatch shaper, and offers tunability over a wide frequency range.

The present disclosure also relates to a direct mismatch shaping test. A mismatch shaper is a component designed to enhance the performance of a DAC. However, the performance of a DAC can be influenced by many factors that are not related to mismatches. For example, the DAC can be degraded by intersymbol interference, output-dependent impedances, and speed limitations. The DAC measurement is also susceptible to the resolution limit of the analyzer and limitations of the input pattern.

For these reasons, a DAC output measurement is not necessarily the best method of quantifying the performance of the mismatch shaper, and hence a different test needs to be devised. The mismatch shaper is essentially a router. Thus, if one knew the exact inputs and outputs from the router, then one could then derive the mismatch shaping performance. This test, however, would then require the ability to simultaneously capture eight output bit streams at 2 GHz.

The present disclosure provides an extremely simple test to discover the mismatch shaping performance for a shaper block.

Figure 19:
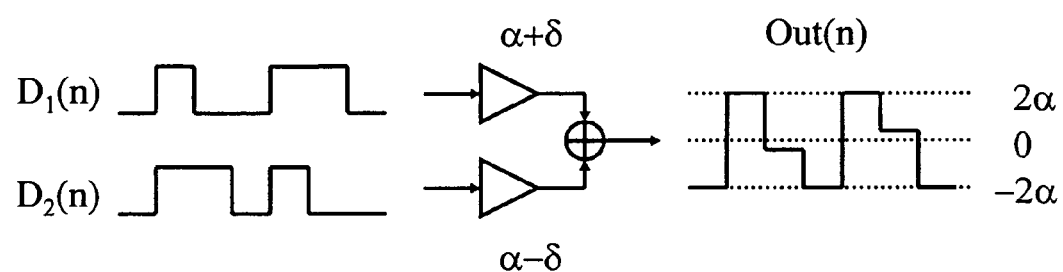
FIG. 19 shows a two-element DAC.

FIG. 19 shows a two-element DAC with static mismatch errors, driven by digital signals $D1(n)$ and $D2(n)$, which have the value of $+1/-1$. The equation governing the output of FIG. 19 is given by $$\text{Out}(n)=\alpha[D1(n)+D2(n)]+\delta[D1(n)-D2(n)] \qquad \text{[Equation 1]}$$

The first term in Equation 1 is the ideal output, and the second term in equation 1 is the error. As also shown throughout the present disclosure, the error can be reduced regardless of the value of $\delta$, by controlling the spectrum $D1(z)-D2(z)$ so that it has a notch in the frequency of interest.

According to the present-disclosure, the circuit of FIG. 19 is revised, so that the output of the second DAC-is subtracted from the output of the first DAC. This is shown in FIG. 20.

Figure 20:
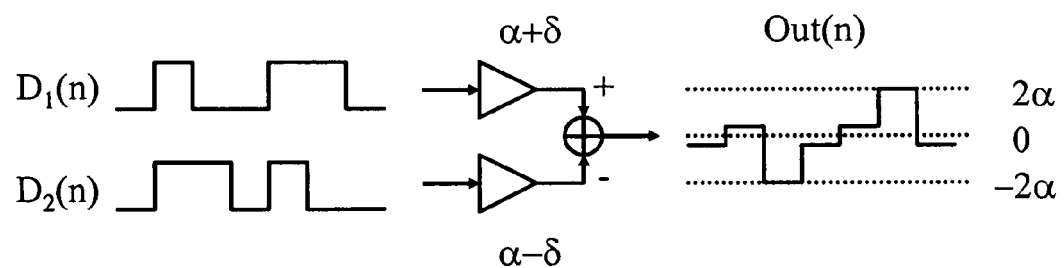
FIG. 20 shows a modified two-element DAC.

The equation governing the output of FIG. 20 is given by $$\text{Out}(n)=\alpha[D1(n)-D2(n)]+\delta[D1(n)+D2(n)] \qquad \text{[Equation 2]}$$

Since $\alpha \gg \delta$, the output spectrum $\text{Out}(z) \approx D1(z)-D2(z)$. This means that the output spectrum obtained from Equation 1 is essentially identical to the spectrum of the DAC mismatch errors obtained from Equation 1. Therefore, the error spectrum largely dictates the output spectrum.

Figure 21:
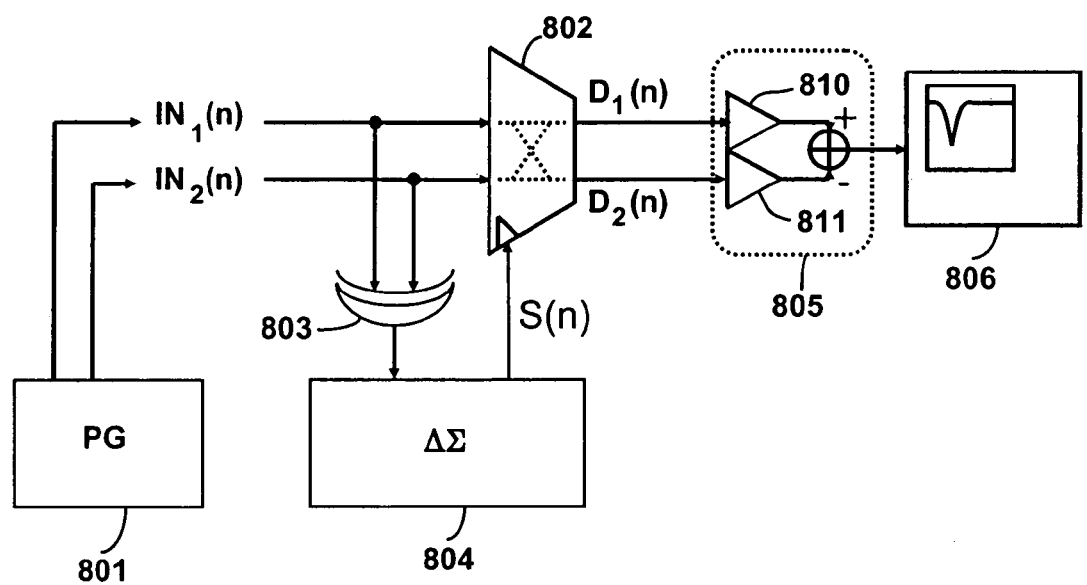
FIG. 21 shows a test structure for a DAC.

Based on the above observation, a test structure is shown in FIG. 21. A pattern generator 801 generates the thermometer-coded inputs $IN1(n)$ and $IN2(n)$. The multiplexer 802, XOR gate 803 and delta-sigma modulator 804 are of the type disclosed throughout the present disclosure. A DAC-structure 805, containing DACs 810 and 811, modified in accordance with the above FIG. 20, is placed at the output of the multiplexer 802. Measure of the difference $D1(z)-D2(z)$ by means of a spectrum analyzer 806 will allow measure of the error.

Figure 22:
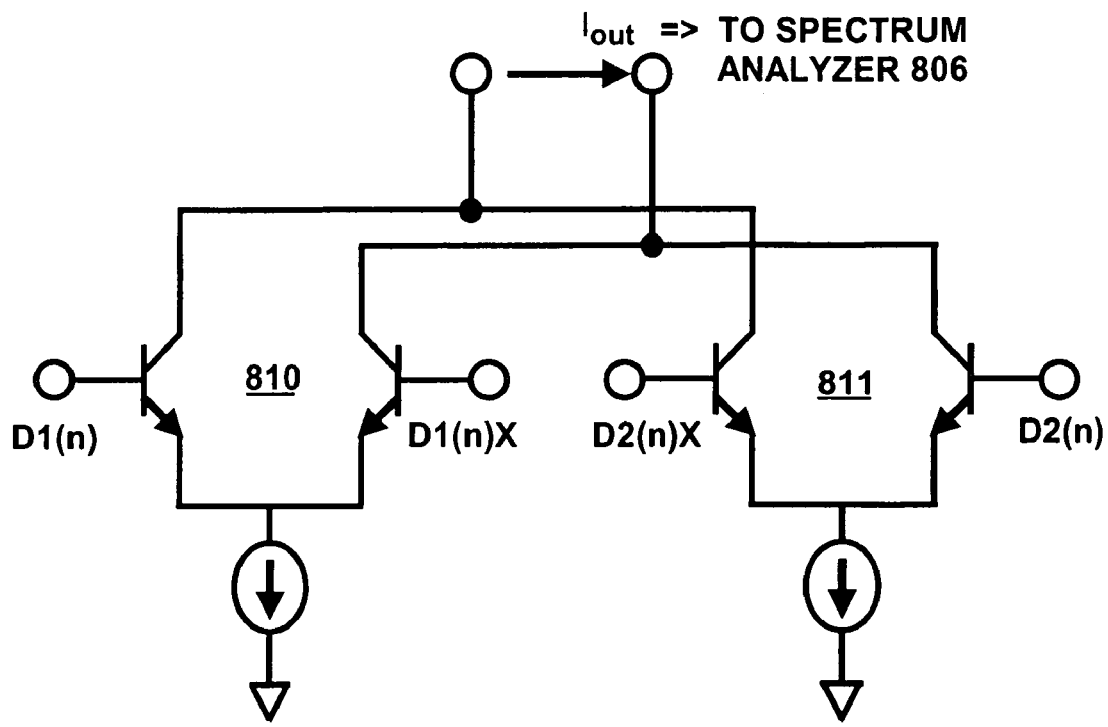
FIG. 22 shows a circuit implementation of the two-element DAC of FIGS. 20 and 21.

FIG. 22 shows a preferred embodiment of the DAC-structure 805. Because the DACs 810 and 811 are differential, the subtraction operation is performed by crossing the wires between the DACs 810, 811.

Figure 23:
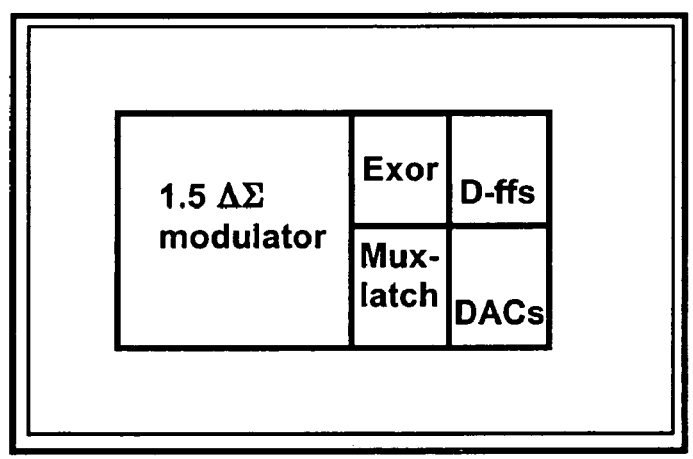
FIG. 23 shows a representation of a die photo with the elements of the test structure of FIG. 21.
Figures 24A, 24B, 24C:
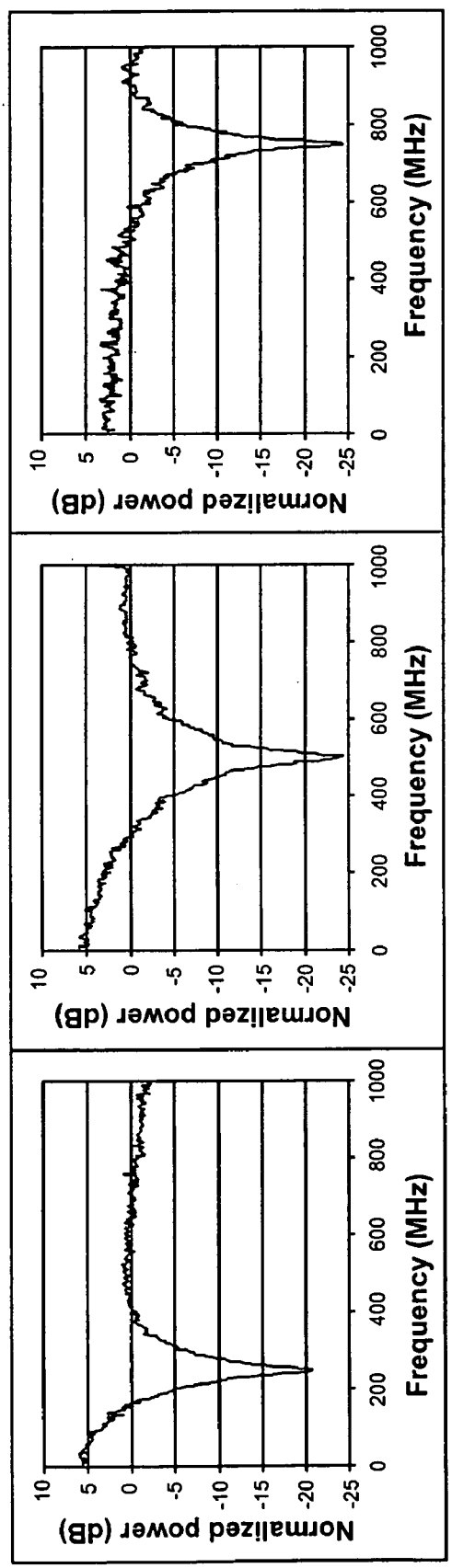
FIGS. 24A–24C show the response of the structure of FIG. 23 as measured on a spectrum analyzer.

FIG. 23 shows the die photo for a chip containing the structure shown in FIG. 21. The response was measured on a spectrum analyzer. FIGS. 24A–24C show the output response, which was normalized by setting the average output power to 0 dB. In particular, FIG. 24A shows the normalized output power spectrum tuned at 250 MHz, FIG. 24B shows the normalized output power spectrum tuned at 500 MHz, and FIG. 24C shows the normalized output power spectrum tuned at 750 MHz. The mismatch error was reduced by over 20 dB for the frequencies tested. The test results verified the performance of the mismatch shaping block at 2 Gs/s operation.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

What is claimed is:

1. A switching arrangement comprising:
    a digital input comprising a first digital input portion and a second digital input portion;
    a digital output comprising a first digital output portion and second digital output portion;
    a switching element between the digital input and the digital output, the switching element having a first condition allowing the first digital output portion to correspond to the first digital input portion and the second digital output portion to correspond to the second digital input portion and a second condition allowing the first digital output portion to correspond to the second digital input portion and the second digital output portion to correspond to the first digital input portion; and
    a control arrangement to switch the switching element between the first condition and the second condition, wherein the control arrangement comprises analog processing elements;
    wherein the control arrangement has a first control input connected with the first digital input portion, a second control input connected with the second digital input portion, and a control output, the control output allowing the switching element to assume the second condition if the first digital input portion is different from the second digital input portion.

2. The switching arrangement of claim 1, wherein the switching element is a multiplexer.

3. The switching arrangement of claim 2, wherein the switching element is a latched multiplexer.

4. A switching arrangement comprising:
    a digital input comprising a first digital input portion and a second digital input portion;
    a digital output comprising a first digital output portion and second digital output portion;
    a switching element between the digital input and the digital output, the switching element having a first condition allowing the first digital output portion to correspond to the first digital input portion and the second digital output portion to correspond to the second digital input portion, and a second condition allowing the first digital output portion to correspond to the second digital input portion and the second digital output portion to correspond to the first digital input portion; and
    a control arrangement to switch the switching element between the first condition and the second condition, wherein the control arrangement has a first control input connected with the first digital input portion, a second control input connected with the second digital input portion, and a control output, the control output allowing the switching element to assume the second condition if the first digital input portion is different from the second digital input portion, and
        wherein the control arrangement comprises a subtractor, subtracting the first digital input portion from the second digital input portion, the subtractor having a subtractor output with a first subtractor output value if the first digital input portion is not in a predetermined relationship with the second digital input portion and a second subtractor output value if the first digital input portion is in a predetermined relationship with the second digital input portion.

5. The switching arrangement of claim 4, wherein the predetermined relationship between the first digital input portion and the second digital input portion is that the first digital input portion is identical to the second digital input portion.

6. The switching arrangement of claim 4, wherein the first digital input portion and the second digital input portion are multi-bit inputs comprising high digital values and low digital values, and wherein the predetermined relationship between the first digital input portion and the second digital input portion is that a sum between the high digital values of the first digital input portion is identical to a sum between the high digital values of the second digital input portion.

7. The switching arrangement of claim 4, wherein the control arrangement comprises a delta-sigma modulator, the subtractor output being input into the delta-sigma modulator.

8. The switching arrangement of claim 7, wherein the delta-sigma modulator comprises a quantizer having a quantizer input and a quantizer output.

9. The switching arrangement of claim 4, wherein the subtractor is an XOR gate and the first and second digital input are thermometer coded.

10. The switching arrangement of claim 8, wherein the delta-sigma modulator comprises:
a filtering element, having a filter element input and a filter element output, the filtering element output corresponding to the quantizer input; and
a digital-to-analog converter (DAC) having a DAC input and a DAC output, the DAC output corresponding to the resonator input.

11. The switching arrangement of claim 10, wherein the filtering element is a second-order resonator.

12. The switching arrangement of claim 11, wherein the resonator comprises:
a first analog resonator transconductor having a variable gain;
a second analog resonator transconductor;
a first delay element; and
a second delay element.

13. The switching arrangement of claim 12, wherein the first delay element has a controllable gain.

14. The switching arrangement of claim 13, wherein the first delay element comprises a first switched emitter follower track-and-hold amplifier, a second switched emitter follower track-and-hold amplifier, and an adjustable gain amplifier between the first switched emitter follower track-and-hold amplifier and the second switched emitter follower track-and-hold amplifier.

15. The switching arrangement of claim 10, wherein the filtering element is an integrator.

16. The switching arrangement of claim 10, wherein the filtering element is a differentiator.

17. The switching arrangement of claim 10, wherein the control arrangement further comprises a multiplier, the multiplier multiplying the subtractor output with the quantizer output.

18. The switching arrangement of claim 17, wherein a signal fed between the multiplier and the DAC input is a ternary signal.

19. The switching arrangement of claim 18, wherein the ternary signal has −1, 0, +1 values.

20. The switching arrangement of claim 10, wherein the subtractor is a XOR gate.

21. The switching arrangement of claim 20, wherein the control arrangement further comprises a multiplexer, the multiplexer selecting among the quantizer output and an auxiliary value based upon the value of the subtractor output.

22. The switching arrangement of claim 20, wherein the DAC comprises a first analog DAC transconductor having a variable gain and a second analog DAC transconductor, the resonator comprising:
a first analog resonator transconductor having a variable gain;
a second analog resonator transconductor;
a first delay element having a first delay element input;
a second delay element having a second delay element input;
a first adder, adding the output of the first delay element with the output of the first analog DAC transconductor and the output of the first analog resonator transconductor; and
a second adder, adding the output of the second analog DAC transconductor with the output of the second analog resonator transconductor.

23. The switching arrangement of claim 22, wherein the output of the first delay element is fed back to the input of the first analog resonator transconductor, to the input of the second analog resonator transconductor, and to the input of the quantizer.

24. The switching arrangement of claim 23, wherein the subtractor output is input into the sigma-delta modulator by means of a multiplexer located between the quantizer output and the DAC input, and wherein the multiplexer is incorporated into the first analog DAC transconductor and the second analog DAC transconductor.

25. The switching arrangement of claim 22, wherein the subtractor output is input into the sigma-delta modulator by means of a multiplexer located between the quantizer output and the DAC input, and wherein the multiplexer is incorporated into the first analog DAC transconductor and the second analog DAC transconductor.

26. The switching arrangement of claim 22, wherein the first analog resonator transconductor is frequency controlled.

27. The switching arrangement of claim 22, wherein the resonator comprises a third analog resonator transconductor.

28. The switching arrangement of claim 27, further comprising a first resistor placed before the first delay element input and a second resistor placed before the second delay element input.

29. The switching arrangement of claim 10, wherein the DAC comprises:
a first analog DAC transconductor having a variable gain; and
a second analog DAC transconductor.

30. The switching arrangement of claim 20, wherein the first analog DAC transconductor is frequency controlled.

31. The switching arrangement of claim 8, wherein the quantizer comprises three latch elements.

32. A circuit comprising:
a first input and a second input;
a control element connected with the first input and second input and comprising a delta-sigma modulator;
a switch either switching or not switching the first input and the second input according to the control element; and
a clocking arrangement to pipeline the first input and the second input;
wherein the delta-sigma modulator comprises a filtering element and a guantizer, and wherein the clocking arrangement clocks the filtering element and the guantizer.

33. The circuit of claim 32, wherein the first input and the second input are digital inputs.

34. The circuit of claim 32, wherein the filtering element comprises at least one delay element, the at least one delay element clocked by the clocking arrangement.

35. The circuit of claim 34, wherein the clocked delay element comprises a first switched emitter follower track-and-hold amplifier, a second switched emitter follower track-and-hold amplifier, and an adjustable gain amplifier between the first switched emitter follower track-and-hold amplifier and the second switched emitter follower track-and-hold amplifier.

36. The circuit of claim 32, wherein the quantizer comprises a plurality of latches.

37. A digital-to-analog converter (DAC) mismatch shaper comprising:
a first input and a second input;
a control element comprising at least three control element inputs;
a switch either switching or not switching the first input and the second input according to the control element; and
a tuning arrangement to adjust a frequency spectrum of DAC errors, thus shaping the DAC errors away from a desired frequency band, wherein two of the at least three control element inputs are connected to the first input and the second input, and a third of the at least three control element inputs is connected to the tuning arrangement.

38. The DAC mismatch shaper of claim 37, wherein the first input and the second input are digital inputs.

39. The DAC mismatch shaper of claim 37, wherein the control element comprises a delta-sigma modulator.

40. The DAC mismatch shaper of claim 39, wherein the delta-sigma modulator comprises a filtering element and a quantizer.

41. The DAC mismatch shaper of claim 40, wherein the filtering element comprises at least one delay element.

42. The DAC mismatch shaper of claim 41, wherein the delay element comprises an adjustable gain circuit.

43. The DAC mismatch shaper of claim 40, wherein the filtering element further comprises a plurality of transconductors, and wherein the tuning arrangement frequency-adjusts at least one transconductor of the plurality of transconductors.

44. A switching arrangement comprising:
a first digital input;
a second digital input;
a switch for switching the first digital input and the second digital input;
an evaluation element connected with the first digital input and the second digital input, the evaluation element evaluating whether the first digital input and the second digital input are in a predetermined relationship therebetween;
a control element to control switching of the switch, the control element connected with the evaluation element and the switching element, the control element comprising a quantizer having a quantizer output, wherein switching between the first digital input and the second digital input depends on the quantizer output when the first digital input and the second digital input are in the predetermined relationship therebetween and switching between the first digital input and the second digital input does not depend on the quantizer output when the first digital input and the second digital input are not in the predetermined relationship therebetween.

45. The switching arrangement of claim 44, wherein the predetermined relationship between the first digital input and the second digital input is that the first digital input is identical to the second digital input.

46. The switching arrangement of claim 44, wherein the first digital input and the second digital input are multi-bit inputs comprising high digital values and low digital values, and wherein the predetermined relationship between the first digital input and the second digital input is that a sum between the high digital values of the first digital input is identical to a sum between the high digital values of the second digital input.

47. The switching arrangement of claim 44, wherein the quantizer is part of a delta-sigma modulator.

48. The switching arrangement of claim 47, wherein the delta-sigma modulator further comprises a filtering element and a digital-to-analog converter (DAC).

49. A mismatch error shaper comprising:
a) a digital input comprising a plurality of bits;
b) a plurality of routing blocks routing the bits of the plurality of bits, wherein each routing block of the plurality of routing blocks comprises:
b1) a digital input having a first digital input portion and a second digital input portion;
b2) a switch for switching the first digital input portion and the second digital input portion;
b3) an evaluation element connected with the first digital input portion and the second digital input portion, the evaluation element evaluating whether the first digital input portion and the second digital input portion are in a predetermined relationship therebetween;
b4) a control element to control switching of the switch, the control element comprising a quantizer having a quantizer output, wherein switching between the first digital input portion and the second digital input portion depends on the quantizer output when the first digital input portion and the second digital input portion are in the predetermined relationship therebetween and switching between the first digital input portion and the second digital input portion does not depend on the quantizer output when the first digital input portion and the second digital input portion are not in the predetermined relationship therebetween;
c) a plurality of digital outputs; and
d) an adder, adding the outputs of the plurality of digital outputs.

50. The mismatch error shaper of claim 49, further comprising a clock arrangement to pipeline the routing blocks.

51. The mismatch error shaper of claim 49, further comprising a tuning arrangement connected with the routing blocks, to shape errors away from a desired frequency band.

52. The mismatch error shaper of claim 49, wherein the quantizer is part of a delta-sigma modulator.

53. The mismatch error shaper of claim 52, wherein the delta-sigma modulator further comprises a filtering element connected with the quantizer.

54. The mismatch error shaper of claim 53, wherein the filtering element is selected from the group consisting from a resonator, an integrator, and a differentiator.

55. The mismatch error shaper of claim 53, wherein the filtering element is a second-order resonator.

56. The mismatch error shaper of claim 55, wherein the second-order resonator comprises:
a first analog resonator transconductor;
a second analog resonator transconductor;
a first delay element;
a second delay element; and
an adder adding the output of the first delay element with the output of the first analog resonator transconductor.

57. The mismatch error shaper of claim 56, wherein the first analog resonator transconductor has a variable gain.

58. The mismatch error shaper of claim 56, wherein the first analog resonator transconductor is frequency controlled.

59. The mismatch error shaper of claim 53, further comprising a digital-to-analog converter (DAC) connected with the filtering element.

60. The mismatch error shaper of claim 59, wherein the DAC is frequency controlled.

61. The mismatch error shaper of claim 59, wherein the DAC comprises:
a first analog DAC transconductor; and
a second analog DAC transconductor.

62. The mismatch error shaper of claim 61, wherein the first analog DAC transconductor has a variable gain.

63. The mismatch error shaper of claim 62, wherein the first analog DAC transconductor is frequency controlled.

64. A method for testing mismatch shaping comprising:
providing a circuit, the circuit comprising a first input and a second input, a control arrangement; and a switching arrangement either switching or not switching the first input and the second input according to the control arrangement, the circuit having a first circuit output and a second circuit output;
providing a first DAC having a first DAC input and a first DAC output;
providing a second DAC having a second DAC input and a second DAC output;
connecting the first circuit output with the first DAC input and the second circuit output with the second DAC input;
subtracting the second DAC output from the first DAC output to provide a difference output; and
inputting the difference output to a spectrum analyzer.

* * * * *